(12) United States Patent
Fujino et al.

(10) Patent No.: US 10,559,538 B2
(45) Date of Patent: Feb. 11, 2020

(54) POWER MODULE

(71) Applicant: MITSUBISHI ELECTRIC CORPORATON, Chiyoda-ku, Tokyo (JP)

(72) Inventors: Junji Fujino, Tokyo (JP); Shohei Ogawa, Tokyo (JP); Soichi Sakamoto, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 308 days.

(21) Appl. No.: 15/533,870

(22) PCT Filed: Feb. 9, 2016

(86) PCT No.: PCT/JP2016/053779
§ 371 (c)(1),
(2) Date: Jun. 7, 2017

(87) PCT Pub. No.: WO2016/136457
PCT Pub. Date: Sep. 1, 2016

(65) Prior Publication Data
US 2017/0338190 A1   Nov. 23, 2017

(30) Foreign Application Priority Data
Feb. 25, 2015 (JP) .................... 2015-034734

(51) Int. Cl.
*H01L 23/373* (2006.01)
*H01L 23/31* (2006.01)
(Continued)

(52) U.S. Cl.
CPC ........ *H01L 23/562* (2013.01); *H01L 23/3142* (2013.01); *H01L 23/3672* (2013.01);
(Continued)

(58) Field of Classification Search
CPC . H01L 23/492; H01L 23/3735; H01L 23/051; H01L 25/072; H01L 24/38; H01L 24/37; H01L 24/40
See application file for complete search history.

(56) References Cited

U.S. PATENT DOCUMENTS

2003/0058628 A1* 3/2003 Boylan .................. H05K 1/141
361/767
2006/0138532 A1 6/2006 Okamoto et al.
(Continued)

FOREIGN PATENT DOCUMENTS

CN   103219301 A   7/2013
JP   2003-347507 A   12/2003
(Continued)

OTHER PUBLICATIONS

Office Action dated Feb. 15, 2019, by the Chinese Patent Office in corresponding Chinese Patent Application No. 201680006146.4 and English translation of the Office Action. (14 pages).
(Continued)

*Primary Examiner* — Zandra V Smith
*Assistant Examiner* — Jeremy J Joy
(74) *Attorney, Agent, or Firm* — Buchanan Ingersoll & Rooney PC

(57) ABSTRACT

A power module of the invention includes a power semiconductor element mounted on a circuit board, and an adapter connected to a front-surface main electrode of the element, wherein the adapter includes a main-electrode wiring member which is connected to the front-surface main electrode of the element; and wherein the main-electrode wiring member includes: an element connection portion connected to the front-surface main electrode of the element; a board connection portion which is placed outside the element connection portion and connected to the circuit board; and a connector connection portion which is placed
(Continued)

outside the element connection portion and connected to an external electrode through a connector.

20 Claims, 10 Drawing Sheets

(51) Int. Cl.
    *H01L 23/367*    (2006.01)
    *H01L 23/00*    (2006.01)
    *H01L 25/18*    (2006.01)

(52) U.S. Cl.
    CPC .......... *H01L 23/3735* (2013.01); *H01L 24/40* (2013.01); *H01L 25/18* (2013.01); *H01L 2224/40227* (2013.01); *H01L 2224/40496* (2013.01); *H01L 2224/40499* (2013.01); *H01L 2924/01013* (2013.01); *H01L 2924/01029* (2013.01); *H01L 2924/1033* (2013.01); *H01L 2924/10254* (2013.01); *H01L 2924/10272* (2013.01); *H01L 2924/1203* (2013.01); *H01L 2924/13055* (2013.01); *H01L 2924/3512* (2013.01)

(56) References Cited

U.S. PATENT DOCUMENTS

| | | | | |
|---|---|---|---|---|
| 2006/0192291 A1* | 8/2006 | Yokozuka | ............... | H01L 24/29 257/776 |
| 2007/0040186 A1* | 2/2007 | Fillion | ............... | H01L 23/4821 257/177 |
| 2013/0181228 A1* | 7/2013 | Usui | ................... | H01L 23/4334 257/77 |
| 2014/0117525 A1* | 5/2014 | Lee | ..................... | H01L 23/3121 257/676 |
| 2015/0021750 A1* | 1/2015 | Fujino | ..................... | H01L 23/24 257/667 |
| 2015/0287665 A1* | 10/2015 | Hanada | ................. | H01L 25/115 257/691 |
| 2016/0300770 A1* | 10/2016 | Taya | ................... | H01L 23/3142 |
| 2017/0154855 A1* | 6/2017 | Oi | ........................... | H01L 24/40 |
| 2017/0338189 A1* | 11/2017 | Soda | ...................... | H01L 25/18 |
| 2018/0047649 A1* | 2/2018 | Bando | ................ | H01L 29/0688 |

FOREIGN PATENT DOCUMENTS

| | | |
|---|---|---|
| JP | 2006-179735 A | 7/2006 |
| JP | 2013-065836 A | 4/2013 |

OTHER PUBLICATIONS

Second Office Action dated Sep. 19, 2019, by the State Intellectual Property Office of the People's Republic of China in corresponding Chinese Patent Application No. 201680006146.4 and an English translation of the Office Action. (10 pages).
International Search Report (PCT/ISA/210) dated May 10, 2016, by the Japanese Patent Office as the International Searching Authority for International Application No. PCT/JP2016/053779.
Written Opinion (PCT/ISA/237) dated May 10, 2016, by the Japanese Patent Office as the International Searching Authority for International Application No. PCT/JP2016/053779.

\* cited by examiner

// POWER MODULE

TECHNICAL FIELD

The present invention relates to power modules which are used in situations all over from those in electric power generation and electric power transmission to those in efficient utilization and regeneration of energy.

BACKGROUND ART

Power modules are becoming widespread for the products all over from industrial apparatuses to home electronics and information terminals, and with respect to the modules to be mounted in the home electronics, they are required to have high productivity and high reliability that allow them to deal with a wide variety of products as well as to be made compact and lightweight. Meanwhile, as power semiconductor elements to be mounted in the power modules, SiC (silicon carbide) power semiconductor elements are highly likely to go mainstream in future because they are high in operation temperature and superior in efficiency. For that reason, the power modules are also required to have package configurations that are applicable to high-temperature operations of the SiC power semiconductor elements.

In Patent Document 1, a semiconductor device is described in which a power MISFET (Metal Insulator Semiconductor Field-Effect-Transistor) with a vertical structure is encapsulated with a resin. The package of the semiconductor device of Patent Document 1 is a surface-mount CSP (Chip Scale Package) in which package terminals are placed in the lower part thereof. The semiconductor device of Patent Document 1 is packaged in such a manner that a power semiconductor element (power MISFET) sandwiched between wiring members is resin-molded. On the upper part of the thus-packaged encapsulation product 1, the upper surface portion of a connection member 3DL connected to the drain electrode of the power semiconductor element is exposed, and on the lower part of the encapsulation product 1, a connection member 3SL connected to the source electrode of the power semiconductor element and a connection member 3GL connected to the gate electrode thereof are exposed.

In Patent Document 2, a power semiconductor device is described which is provided with an electrode structure in which, for the purpose of reducing the stress that is applied due to an external wiring member to a power semiconductor element (semiconductor element for electric power), an electrode member for connecting the upper electrode (front-surface electrode) of the power semiconductor element mounted on a circuit board, to the external wiring member, is connected in the middle to the circuit board.

CITATION LIST

Patent Document

Patent Document 1: Japanese Patent Application Laid-open No. 2006-179735 (Paragraphs 0023 to 0048 and FIG. 5)
Patent Document 2: Japanese Patent Application Laid-open No. 2013-65836 (Paragraph 0008, Paragraphs 0013 to 0021, and FIG. 2)

SUMMARY OF THE INVENTION

Problems to be Solved by the Invention

Although the power modules deal with a high voltage and a large current and thus generate a large amount of heat, there is a great need for their high-temperature operations. In addition, an application of new power semiconductor elements, as represented by those of SiC by which improvements in their characteristics are expected becomes imperative, and these elements are operable at such a high temperature exceeding 250° C. As a result, high heat resistance is required for the configurations of the power modules and their packages, as well as their bonding portions. With respect to a die-bonding method for the back-surface side (for example, the collector side) of the power semiconductor element, silver sintering-bonding with the application of low-temperature sintering phenomenon of a nano powder, is coming into practical use in place of conventional soldering, so that it is almost certain on how to improve the heat resistance. With respect to connection between the front-surface side (emitter side) of the power semiconductor element and the circuit board or the external terminal, a copper wire, etc. is under investigation as a high heat-resistant material alternative to an aluminum wire. However, copper, which has hardness higher than that of aluminum, causes large damage to the power semiconductor element and thus raises concerns of cracking the front-surface electrode (emitter electrode, etc.) of the power semiconductor element and reducing the reliability thereof. In addition, at the time the copper wire is to be bonded, a special apparatus for reducing its oxidation is required, so that complexity in equipment, for example, on the supply of a reductive gas, is inevitably brought in.

The package of the semiconductor device of Patent Document 1 is a surface-mount CSP, so that the semiconductor device of Patent Document 1 can be mounted as it is on the surface of a printed-circuit board or the like. With respect to power modules used in inverter apparatuses and the like for driving automotive equipment and AC motors, namely, the power modules that deal with a large current, they are required to be connected to external electrode parts, such as external screw-fastened electrodes and the like, by use of a wire, a bus bar and the like. When the package of Patent Document 1 is to be used, with respect to the connection between the front-surface electrode of the power semiconductor element and the external electrode part, it is necessary to establish wiring connection or bus-bar connection that is once routed through a conductive layer on a ceramic board (circuit board) and extends from the conductive layer to the external electrode part. This increases the mounting area, so that a problem arises in that the power module in which the power semiconductor element is mounted can not be downsized. According to the power semiconductor device of Patent Document 1, it is also allowable to connect using a wire, an exposed portion of the connection member 3DL exposed on the upper surface portion, to the external screw-fastened electrode or the like; however, reduction in temperature of the wire used for that connection is less likely to be expected just above the power semiconductor element, so that the wire itself is required to have high heat resistance at the time of a high temperature operation.

With respect to the power semiconductor device of Patent Document 2, such an electrode structure has been described in which the electrode member for connecting the upper electrode (front-surface electrode) of the power semiconductor element to the external wiring member, is connected in the middle to the circuit board; however, an end portion of the electrode member and a terminal where the external electrode part is screw-fastened, are connected to each other by way of a long electric line, and there is no description stating that the end portion of the electrode member and the external electrode part are connected to each other by way of a wire, and that the end portion of the electrode member and the electric line are connected to each other by way of a wire.

This invention has been made to solve the problem as described above, and an object thereof is to provide a power module which can make connection between the external terminal part and the front-surface electrode of the power semiconductor element without the connection being routed through the conductive layer on the circuit board, and which is operable at a high temperature even when a connector such as a wire, etc. connected to the external terminal part is made of a solder or aluminum, and is thus improved in its reliability.

Means for Solving the Problem

A power module of the invention is characterized by comprising a power semiconductor element mounted on a circuit board, and an adapter connected to a front-surface main electrode of the power semiconductor element, wherein the adapter includes a main-electrode wiring member which is connected to the front-surface main electrode of the power semiconductor element; and wherein the main-electrode wiring member includes: an element connection portion connected to the front-surface main electrode of the power semiconductor element; a board connection portion which is placed outside the element connection portion and connected to the circuit board; and a connector connection portion which is placed outside the element connection portion and connected to an external electrode through a connector.

Effect of the Invention

According to the power module of the invention, the main-electrode wiring member of the adapter connected to the front-surface main electrode of the power semiconductor element, includes the connector connection portion which is outside the element connection portion and the board connection portion, and which is connected to the external electrode through the connector. Thus, the power module can make connection between the external electrode provided as an external terminal part and the front-surface electrode of the power semiconductor without the connection being routed through the conductive layer on the circuit board, and is operable at a high temperature even when the connector connected to the external terminal part is made of a solder or aluminum, thus making it possible to improve the reliability.

MODES FOR CARRYING OUT THE INVENTION

Embodiment 1

Figure 1:
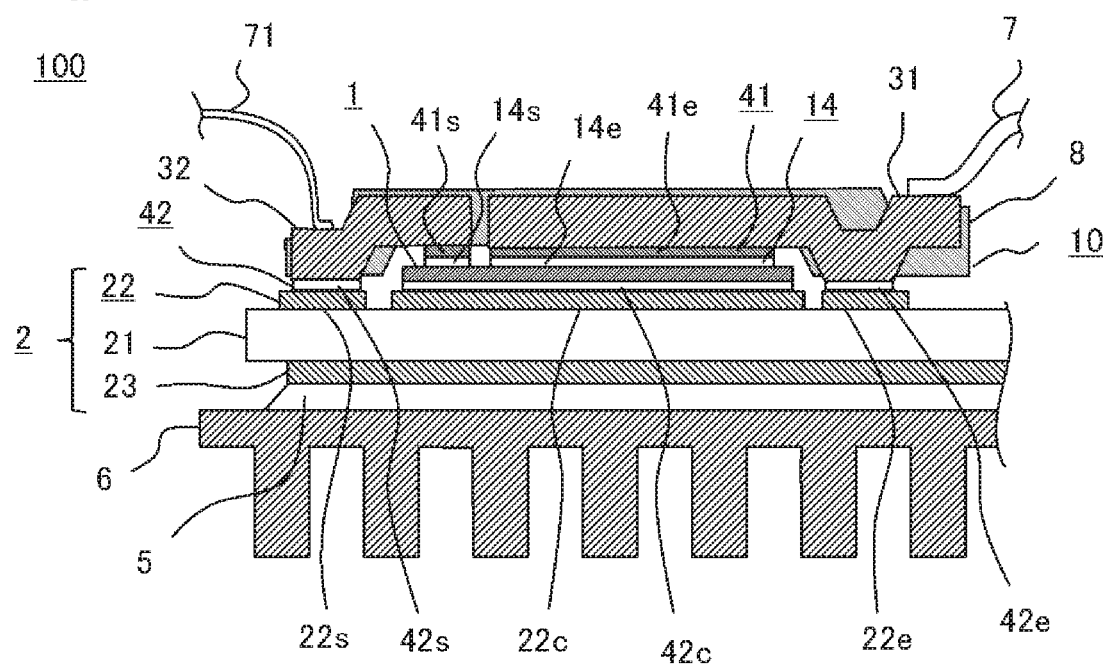
FIG. 1 is a cross-sectional schematic view of a power module according to Embodiment 1 of the invention.
Figure 2:
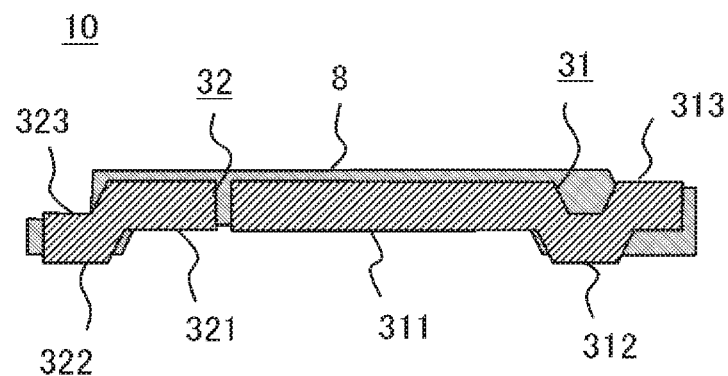
FIG. 2 is a diagram showing an adapter in FIG. 1.
Figure 3:
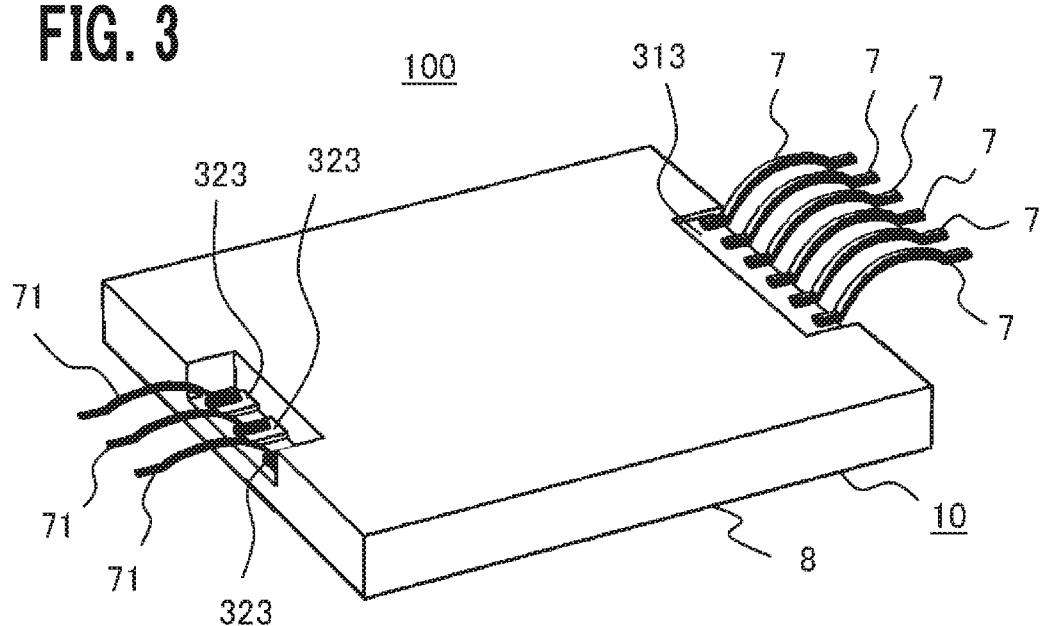
FIG. 3 is a bird's-eye view of the power module according to Embodiment 1 of the invention.
Figure 4:
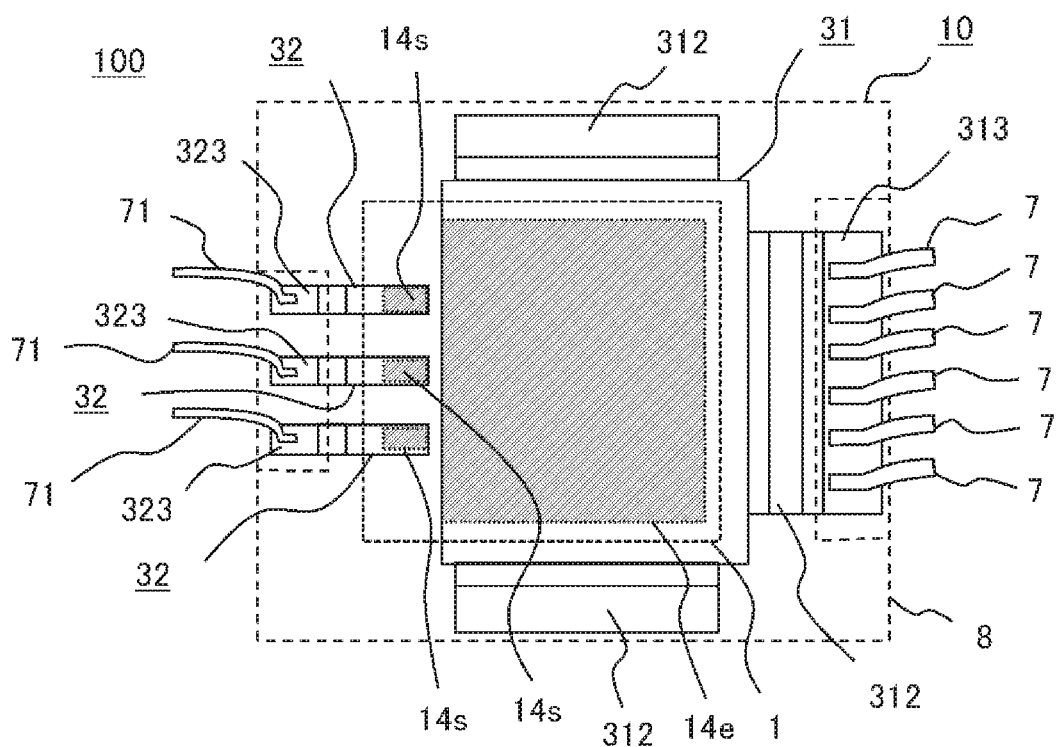
FIG. 4 is a top view showing an internal configuration of the adapter in FIG. 3.
Figure 5:
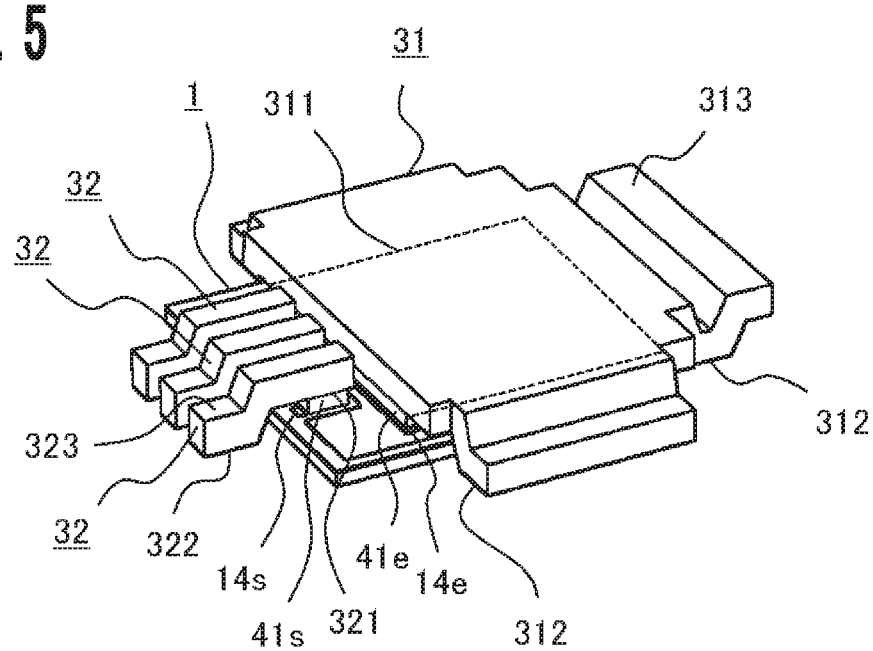
FIG. 5 is a bird's-eye view showing wiring members in FIG. 4.
Figure 6:
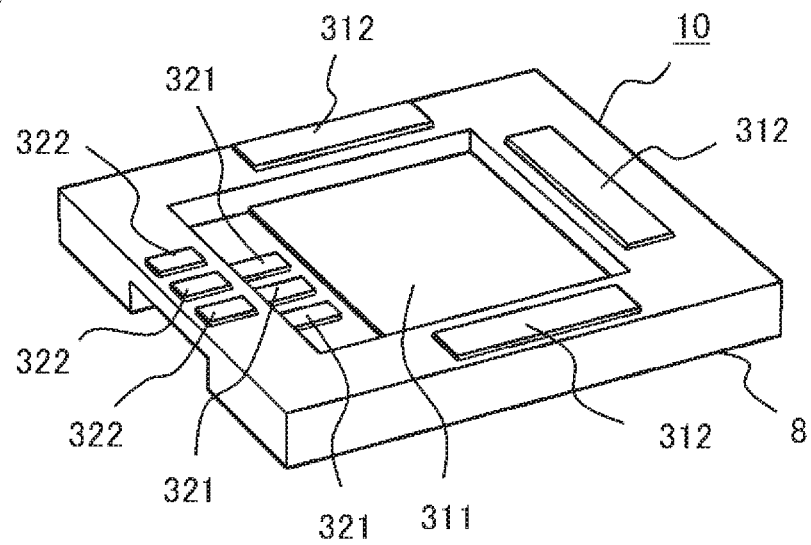
FIG. 6 is a bird's-eye view on the back surface of the adapter of FIG. 4.
Figure 7:
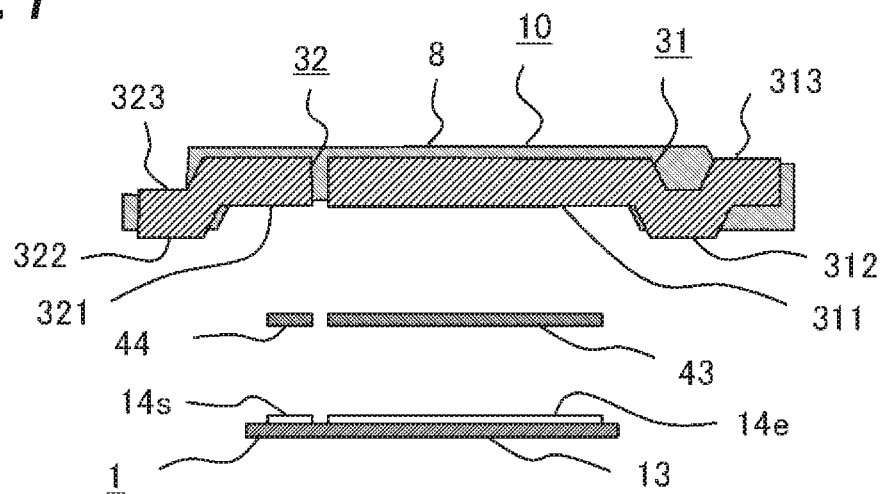
FIG. 7 is a diagram for showing a fabrication step of the power module of FIG. 1.
Figure 8:
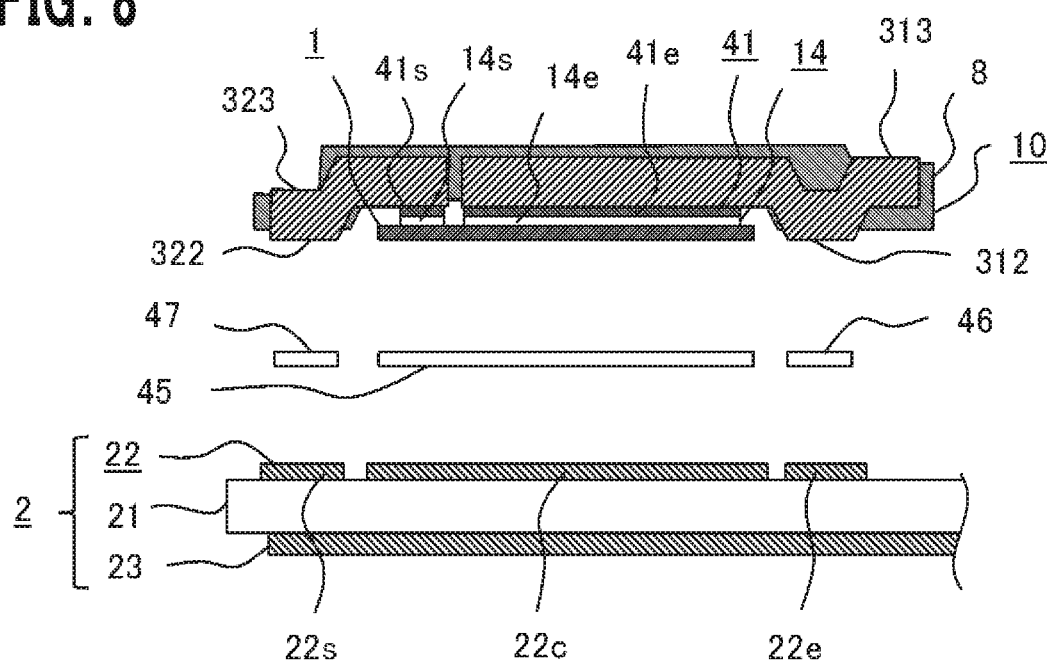
FIG. 8 is a diagram for showing a fabrication step of the power module of FIG. 1.

FIG. 1 is a cross-sectional schematic view of a power module according to Embodiment 1 of the invention, and FIG. 2 is a diagram showing an adapter in FIG. 1. FIG. 3 is a bird's-eye view of the power module according to Embodiment 1 of the invention, and FIG. 4 is a top view showing an internal configuration of the adapter in FIG. 3. FIG. 5 is a bird's-eye view showing wiring members in FIG. 4, and FIG. 6 is a bird's-eye view on the back surface of the adapter of FIG. 4. FIG. 7 and FIG. 8 are diagrams for showing fabrication steps of the power module of FIG. 1. A power module 100 includes: a power semiconductor element 1; a ceramic board 2 that is a circuit board on which the power semiconductor element 1 is mounted; an adapter 10 having wiring members connected to a front-surface electrode 14 of the power semiconductor element 1; and a heat dissipation fin 6.

The ceramic board 2 is mounted on the heat dissipation fin 6 by use of a thermal grease 5. The heat dissipation fin 6 is formed, for example, by aluminum forging, whose size is 100 mm in length, 150 mm in width and 12 mm in thickness. The ceramic board 2 includes a ceramic base member 21, a conductive layer 22 formed on the front side of the ceramic base member 21, and a conductive layer 23 formed on the back side of the ceramic base member 21. The ceramic base member 21 is made, for example, of AlN (aluminum nitride), whose size is 95 mm in length, 145 mm in width and 0.635 mm in thickness. The conductive layers 22 and 23 are made, for example, of copper, and have a thickness of 0.4 mm. The conductive layer 22 is formed into a plurality of patterns, an example of which is illustrated in FIG. 1 as having three conductive layers 22c, 22s, 22e. On the surface of the conductive layer 22, a silver-sintered bonding portion 42 is formed. The silver-sintered bonding portion 42 has silver-sintered bonding portions 42c, 42s, 42e corresponding to the conductive layers 22c, 22s, 22e.

To the conductive layer 22, the power semiconductor element 1 is die-bonded using a silver-sintering bonding material. The power semiconductor element 1 is, for example, an IGBT (Insulated Gate Bipolar Transistor) made of Si (silicon), whose size is 15 mm in length, 15 mm in width and 0.3 mm in thickness. A collector electrode 13 formed on the back-surface side of the power semiconductor element 1 is connected to the conductive layer 22*c* through the silver-sintered bonding portion 42*c* resulting from solidification of the silver-sintering bonding material. The front-surface electrode 14 formed on the front-surface side of the power semiconductor element 1 provided as the IGBT, comprises an emitter electrode 14*e* and signal electrodes (front-surface signal electrodes) 14*s*. The adapter 10 having plural wiring members, is placed above the power semiconductor element 1. The adapter 10 includes a main-electrode wiring member 31, signal wiring members 32 and an encapsulation resin 8. The main-electrode wiring member 31 and the signal wiring members 32 are formed as they are punched out of a copper frame having a thickness of 0.6 mm. The main-electrode wiring member 31 and the signal wiring members 32 are placed in conjunction with each other, namely, placed adjacent to each other, and are encapsulated with the encapsulation resin 8. The encapsulation resin 8 is made, for example, of PPS (Polyphenylene Sulfide).

The main-electrode wiring member 31 includes: an element connection portion 311 to be connected to the emitter electrode 14*e* of the power semiconductor element 1; board connection portions 312 to be connected to the conductive layer 22*e* of the ceramic board 2; and a wire connection portion (connector connection portion) 313 to be connected to wires 7 serving as connectors. Each of the signal wiring members 32 includes: an element connection portion (element signal-connection portion) 321 to be connected to the signal electrode 14*s* of the power semiconductor element 1; a board connection portion (board signal-connection portion) 322 to be connected to the conductive layer 22*s* of the ceramic board 2; and a wire connection portion (connector signal-connection portion) 323 to be connected to a wire 71 serving as a connector.

The element connection portion 311 of the main-electrode wiring member 31 is exposed from the encapsulation resin 8 and bonded to the emitter electrode 14*e* (front-surface main electrode) of the power semiconductor element 1 by way of a silver-sintered bonding portion 41. The silver-sintered bonding portion 41 is a bonding layer resulting from solidification of a silver-sintering bonding material placed on the front-surface electrode 14 of the power semiconductor element 1. The silver-sintered bonding portion 41 has a silver-sintered bonding portion 41*e* formed on the emitter electrode 14*e*, and a silver-sintered bonding portion 41*s* formed on each of the signal electrodes 14*s*. The board connection portions 312 and the wire connection portion 313 are formed by a step (level-difference)-forming process. As shown in FIG. 4 and FIG. 5, the board connection portions 312 are formed as they are distributed in directions toward three outer edges of the power semiconductor element 1. Of these, with respect to the board connection portion 312 in one direction, the extending end portion thereof is lifted up by a step-forming process, so that the wire connection portion 313 is formed. Each of the board connection portions 312 is connected to the conductive layer 22*e* of the ceramic board 2 through the silver-sintered bonding portion 42*e*. The wire connection portion 313 is exposed upward from the encapsulation resin 8 and is connected to the wires 7.

Like the element connection portion 311 of the main-electrode wiring member 31, the element connection portion 321 of each of the signal wiring members 32 is exposed from the encapsulation resin 8 and is bonded to the signal electrode 14*s* of the power semiconductor element 1 by way of the silver-sintered bonding portion 41*s*. The board connection portion 322 and the wire connection portion 323 are formed by a step-forming process. The board connection portion 322 and the wire connection portion 323 are extended in a direction opposite to a direction toward the wire connection portion 313 of the main-electrode wiring member 31. The board connection portion 322 is connected to the conductive layer 22*s* of the ceramic board 2 through the silver-sintered bonding portion 42*s*. The wire connection portion 323 placed above the board connection portion 322 is exposed upward from the encapsulation resin 8 and is connected to the wire 71. The conductive layer 22 of the ceramic board 2 has the three conductive layers 22*c*, 22*s*, 22*e*, in which the conductive layer 22*s* is connected to the signal electrode 14*s* of the power semiconductor element 1, the conductive layer 22*e* is connected to the emitter electrode 14*e* of the power semiconductor element 1, and the conductive layer 22*c* is connected to the collector electrode (back-surface main electrode) 13 of the power semiconductor element 1. The three conductive layers 22*c*, 22*s*, 22*e* are electrically insulated to each other with an appropriately required distance therebetween, and spaces between them are sealed with a resin. Note that, as a circuit, the three conductive layers 22*c*, 22*s*, 22*e* also have portions that are placed at the same potential.

Further, the wire connection portions 313, 323 are exposed upward, respectively, on the upper surfaces of the main-electrode wiring member 31 and the signal wiring members 32 that are placed opposite to the element connection portions 311, 321 and at the positions lower than the upper surface of the encapsulation resin 8. Thus, these wire connection portions are so designed as not to be projection portions that are obstructive in a heating-pressurizing process at the time the silver-sintered bonding portions 41, 42 are formed. Further, the wire connection portions 313, 323 are nearly flat and exposed in a horizontal plane, and are thus so designed to make it easier to ensure the quality at the time the circuit is formed by wire bonding or the like.

As shown in FIG. 4, in the power module 100 of Embodiment 1, the board connection portions 312 of the main-electrode wiring member 31 are spread in the three directions, and the wire connection portion 313 is formed in one of the directions. Note that, in FIG. 4, the encapsulation resin 8 of the adapter 10 is indicated by a broken line. The number of the wires 7 is determined depending on a current capacity required for the power module 100, and here, wire bonding is performed with six wires 7. In the power module 100 of Embodiment 1, the three signal wiring members 32 are formed, which are connected to the three signal electrodes 14*s*. The three signal electrodes 14*s* are a gate electrode, a temperature-sensing electrode and an anode electrode of the power semiconductor element 1, through which currents flow that are smaller than that through the emitter electrode 14*e* provided as the front-surface main electrode. In comparison with the emitter electrode 14*e*, a smaller current flows through each of the signal electrode 14*s*, resulting in a smaller temperature rise, so that the wire connection portion 323 is provided just above the board connection portion 322.

As shown in FIG. 3, the power module 100 of Embodiment 1 has a structure in which the wire connection portions 313, 323 are one-level lower than the upper surface of the encapsulation resin 8. Note that it is possible to achieve such a structure when the encapsulation resin 8 is formed by an insert molding method. Further, when the encapsulation resin 8 is formed by an insert molding method, it is possible to expose the wire connection portions 313, 323 even in a situation where there is almost no level difference between the upper surfaces of the wire connection portions 313, 323 and the upper surface of the encapsulation resin 8, namely, their levels are nearly the same (substantially the same).

As shown in FIG. 6, when the adapter 10 is viewed from its back side, the element connection portions 311, 321 are exposed in areas that are one-level lower than the board connection portions 312, 322. When this level difference is made nearly the same (substantially the same) as the sum of the thicknesses of the power semiconductor element 1 and the silver-sintered bonding portion 41, it becomes possible, at the time the adapter 10 and the power semiconductor element 1 are bonded to the ceramic board 2, to place the back surface of the power semiconductor element 1 and the board connection portions 312, 322 so that they are at nearly the same (substantially the same) height. When the back surface of the power semiconductor element 1 and the board connection portions 312, 322 are placed so that they are at nearly the same (substantially the same) height, it becomes easier to bond the adapter 10 and the power semiconductor element 1 to the ceramic board 2. Thus, it is possible to apply a force uniformly onto the surfaces to be bonded, to thereby enhance their joining force.

Next, using FIG. 7, FIG. 8 and FIG. 1, a fabrication process of the power module 100 will be described. First, the adapter 10 is fabricated. The adapter 10 is fabricated, for example, by an insert molding method. The adapter 10 is fabricated in such a manner that, after the main-electrode wiring member 31 and the signal wiring members 32 are placed in a mold for insert molding, the encapsulation resin 8 is injected into the mold. The adapter 10 in which the main-electrode wiring member 31 and the signal wiring members 32 are fixed and adhered together by the encapsulation resin 8, is thus completed.

As shown in FIG. 7, using silver-sintering bonding materials 43, 44, the power semiconductor element 1 is, while being heated to 300° C. and subjected to a load of 10 MPa for 10 minutes, bonded to the element connection portions 311, 321 of the adapter 10. As shown in FIG. 8, according to this bonding process, the emitter electrode 14e and the signal electrodes 14s of the power semiconductor element 1 are bonded to the element connection portions 311, 321 of the adapter 10 through the silver-sintered bonding portions 41e, 41s resulting from solidification of the silver-sintering bonding materials 43, 44, respectively. An object resulting from bonding the adapter 10 and the power semiconductor element 1 together is referred to as a semiconductor-element bonded assembly.

Then, as shown in FIG. 8, the position of the semiconductor-element bonded assembly is fixed relative to the ceramic board 2 and then, using silver-sintering bonding materials 45, 46, 47, the back surface of the power semiconductor element 1 and the board connection portions 312, 322 are, while being heated to 300° C. and subjected to a load of 10 MPa for 10 minutes, bonded to the ceramic board. As shown in FIG. 1, according to this bonding process, the collector electrode 13 provided as the back-surface electrode (back-surface main electrode) of the power semiconductor element 1, and the board connection portions 312, 322 of the adapter 10, are bonded to the conductive layers 22c, 22e, 22s of the ceramic board 2 through the silver-sintered bonding portions 42c, 42e, 42s resulting from solidification of the silver-sintering bonding materials 45, 46, 47, respectively.

Then, as shown in FIG. 1, the wires 71 are connected to the wire connection portions 323 of the adapter 10 by use of a wire bonder, and the wires 7 are connected to the wire connection portion 313 of the adapter 10 by use of a wire bonder. The wire 71 is made, for example, of aluminum and has a diameter ϕ of 0.15 mm. The wire 7 is made, for example, of aluminum and has a diameter ϕ of 0.4 mm. Thereafter, using the thermal grease 5, the ceramic board 2 is mounted on the heat dissipation fin 6 and adhered thereto. Lastly, but where necessary, sealing is carried out with a gel (silicone resin), a potting sealing resin (epoxy resin) or the like, in such a manner that the wire bonding portions where the wire connection portions 323 and the wires 71 are bonded together, the wire bonding portions where the wire connection portion 313 and the wires 7 are bonded together, and the like, are immerged in that resin. The heat dissipation fin 6 is made, for example, of aluminum.

In the power module 100 of Embodiment 1, the main-electrode wiring member 31 and the signal wiring members 32 that are connected to the front-surface electrode 14 of the power semiconductor element 1, have the board connection portions 312, 322 that are connected to the ceramic board 2. This makes it possible to dissipate heat at the board connection portions 312, 322 to the ceramic board 2 provided as the circuit board, so that the surface temperatures of the wire connection portions 313, 323 can be made sufficiently lower than the element temperature of the power semiconductor element 1. Because the temperatures of the wire connection portions 313, 323 are sufficiently lower than the operation temperature of the power semiconductor element 1, the power module 100 of Embodiment 1 is operable at a high temperature even when the wires 7, 71 serving as connectors are made of aluminum, thus making it possible to improve the reliability.

Further, in the power module 100 of Embodiment 1, the wire connection portions 313, 323 are formed on the adapter 10, so that the wire bonding process for the power module 100 can be completed on the adapter 10. In the wire bonding process for the power module 100, it is unnecessary to connect the wires 7, 71 to the ceramic board 2 and thus, no wire connection portion is required to be provided on the ceramic board 2, so that the power module 100 can be downsized. Further, in the power module 100 of Embodiment 1, there is no wire connection portion on the ceramic board 2, so that, after the semiconductor-element bonded assembly and the ceramic board 2 are bonded together by silver sintering using the silver-sintering bonding materials 45, 46, 47, cleaning and inspection for the wire bonding portion on the ceramic board 2 are unnecessary and thus, the manufacturing process of the power module 100 can be shortened.

In the power module 100 of Embodiment 1, the wire connection portions 313, 323 of the adapter 10 are each formed to have a surface that is nearly parallel (substantially parallel) to the ceramic base member 21 of the ceramic board 2. Thus, according to the power module 100 of Embodiment 1, it becomes easier to perform wire bonding without application of an ultrasonic wave or wire bonding with application of an ultrasonic wave, for the wire connection portions 313, 323 of the adapter 10.

In the power module 100 of Embodiment 1, the wire connection portions 313, 323 of the adapter 10 are exposed upward, respectively, on the upper surfaces of the main-electrode wiring member 31 and the signal wiring members 32 that are placed opposite to the element connection portions 311, 321 of the adapter 10, and at the positions lower than the upper surface of the encapsulation resin 8. Therefore, according to the power module 100 of Embodiment 1, at the time the element connection portions 311, 321, and the emitter electrode 14e and signal electrodes 14s of the power semiconductor element 1 are bonded together, with application of heat and pressure (by silver-sintering bonding, etc.), because there is no component that projects to a position that is upper than the upper surfaces of the main-electrode wiring member 31 and the signal wiring members 32 that are placed opposite to the element connection portions 311, 321, it is possible to apply a sufficient load in between the element connection portions 311, 321 of the adapter 10 and the emitter electrode 14e and signal electrodes 14s of the power semiconductor element 1, to thereby form high-quality bonding portions. Note that, in the power module 100 of Embodiment 1, the wire connection portions 313, 323 of the adapter 10 may be placed at the height that is the same as that of the upper surfaces of the main-electrode wiring member 31 and the signal wiring members 32 that are placed opposite to the element connection portions 311, 321 of the adapter 10. Even in this case, because there is no component that projects to a position that is upper than the upper surfaces of the main-electrode wiring member 31 and the signal wiring members 32 that are placed opposite to the element connection portions 311, 321, it is possible to apply a sufficient load in between the element connection portions 311, 321 of the adapter 10 and the emitter electrode 14e and signal electrodes 14s of the power semiconductor element 1, to thereby form high-quality bonding portions.

In the power module 100 of Embodiment 1, the upper surfaces of the main-electrode wiring member 31 and the signal wiring members 32 that are placed opposite to the element connection portions 311, 321 of the adapter 10, are covered with the encapsulation resin 8, and thus, at the time the element connection portions 311, 321 and the emitter electrode 14e and signal electrodes 14s of the power semiconductor element 1 are bonded together, with application of heat and pressure (by silver-sintering bonding, etc.), it is possible to apply a load uniformly onto the upper-surface portion of the encapsulation resin 8 of the adapter 10, to thereby reduce damage to the power semiconductor element 1, so that high-quality bonding portions can be formed.

Here, the description has been made citing a case in which the ceramic base member 21 of the ceramic board 2 is made of AlN; however, the base member may be made of SiN (silicon nitride) or alumina. Even in this case, an effect similar to that in the case of the ceramic base member 21 being made of AlN is achieved. With respect also to the conductive layers 22, 23 of the ceramic board 2, there is no need to limit them to those of copper, and they may be of aluminum. Further, a metallic board in which a resin insulating layer is laminated on a metal plate may be used in place of the ceramic board 2.

Here, the description has been made also citing a case where the main-electrode wiring member 31 and the signal wiring members 32 are formed as they are punched out of a copper lead frame. There is no need to limit the materials of the main-electrode wiring member 31 and the signal wiring member 32 to copper, and the material may be Kovar or 42-Alloy having a thermal expansion coefficient close to that of the power semiconductor element 1 or the ceramic board 2, or may use a CIC clad material. Kovar is an alloy of iron mixed with nickel and cobalt. 42-Alloy is an alloy of iron mixed with nickel. The CIC clad material is a clad material in which copper/Invar/copper are laminated. When the main-electrode wiring member 31 and the signal wiring members 32 are formed of a material having a thermal expansion coefficient close to that of the power semiconductor element 1 or the ceramic board 2, it is possible to reduce a thermal stress applied to the silver-sintered bonding portions 41, 42. When the main-electrode wiring member 31 and the signal wiring members 32 are made of copper, the formation of a slit or opening portion in the main-electrode wiring member 31 or the signal wiring member 32 makes it possible for the power module 100 to reduce the rigidity of the main-electrode wiring member 31 or the signal wiring member 32, to thereby reduce a stress applied to the bonding portion, such as the silver-sintered bonding portion 41, 42 or the like. Further, the description has been made citing a case where the wire connection portion 313 is formed on the opposite surface that is opposite to the surface on which the element connection portion 311 and the board connection portions 312 are placed; however, the wire connection portion 313 may be formed on a part of the surface on which the element connection portion 311 and the board connection portions 312 are formed, after the part is provided as an upper surface in such a manner that the end part of the main-electrode wiring member 31 is folded back.

Here, the description has been made also citing a case where the silver-sintering bonding material is used for the bonding between the wiring member, such as the main-electrode wiring member 31 or the signal wiring member 32, and the power semiconductor element 1 or the ceramic board 2; however, when the upper temperature limit required for the power module 100 is not so high, the bonding may be performed using a tin-base solder. When the upper temperature limit required for the power module 100 is high, the bonding may be performed using a bismuth-base solder (melting point: 270° C.) or a gold-tin solder (melting point: 280° C.). Furthermore, high heat resistance can also be achieved when a copper powder-containing tin paste (for example, A-FAP made by KOKI Company Ltd. JAPAN) that exhibits, due to its isothermal solidification, heat resistance against a temperature higher than the bonding temperature, is used as the bonding material.

Here, the description has been made also citing a case where the adapter 10 is fabricated using an insert molding method. The encapsulation resin 8 used in the insert molding method is an insert-molding resin. Further, the description has been made citing a case where PPS (thermal softening temperature: 280° C.) is used as the insert-molding resin; however, there is no need to limit the resin to PPS, and a liquid crystal polymer (thermal softening temperature: 340° C. or more) named LCP-8 (Liquid Crystal Polymer 8) may be used as the insert-molding resin. Other than PPS, LCP-8 is selectable as the insert-molding resin, so that flexibility is enhanced in the selection from the above bonding materials (silver-sintering bonding material, tin-base solder, bismuth-base solder, gold-tin solder, copper powder-containing tin paste).

Furthermore, when the encapsulation resin 8 is a thermoplastic insert-molding resin, it is also allowable to cause the insert-molding resin to melt to spread over the metallic wiring members, such as the main-electrode wiring member 31 and the signal wiring members 32, and the power semiconductor element 1, to thereby serve as their sealing material. Namely, after the adapter 10 and the power semiconductor element 1 are bonded to the ceramic board 2, they are heated up to the softening temperature of the insert-molding resin. This makes it possible to cause the insert-molding resin to thermally soften and melt to spread over the metallic wiring members, such as the main-electrode wiring member 31 and the signal wiring members 32, and the power semiconductor element 1, to thereby serve as their sealing material. In this case, because the encapsulation resin 8 that seals the metallic wiring members, such as the main-electrode wiring member 31 and the signal wiring members 32, is a thermoplastic insert-molding resin, it is possible to concurrently carry out the silver-sintering bonding process for bonding the adapter 10 and the power semiconductor element 1 to the ceramic board 2, and the sealing process for sealing the gaps between the adapter 10 and the ceramic board 2.

Here, the description has been made also citing a case where the wires made of aluminum are used for connecting the wire connection portions 313, 323 of the adapter 10 to the unshown external electrodes; however, other connectors may be instead used. As the other connector, an aluminum-alloy wire or a copper wire, or an aluminum ribbon or a copper ribbon may be used. Favorable bonding can also be done in such a manner that a copper-plate bus bar is subjected to solder bonding or brazing, or to ultrasonic bonding, or a copper-plate bus bar is subjected to spot welding, friction stir welding, or the like.

Note that the description has been made citing a case where the adapter 10, that is to be connected to the front-surface electrode 14 provided as plural electrodes (three signal electrodes 14s and one emitter electrode 14e) in the power semiconductor element 1, includes the main-electrode wiring member 31, the plural signal wiring members 32 and the encapsulation resin 8. In this case, in order to ensure insulated conditions between the closely-placed wiring members (three signal wiring members 32, one main-electrode wiring member 31), it is required to use an insert-molding resin as the encapsulation resin 8. However, in the case where there are no front-surface electrodes close to each other, or the front-surface electrode is a single piece, the insert-molding resin may not be used as the encapsulation resin 8. In the case where there are no front-surface electrodes close to each other, or the front-surface electrode is a single piece, the adapter 10 may be without the encapsulation resin 8, namely, it may include only the main-electrode wiring member 31 and the signal wiring members 32.

When the adapter 10 including only the main-electrode wiring member 31 and the signal wiring members 32 is used, in order to close the spaces on the peripheries, etc. of the main-electrode wiring member 31 and the signal wiring members 32, the spaces are covered with a sealing resin, such as a potting sealing resin, a gel or the like. Note that, in the power module that is provided with the adapter 10 including the main-electrode wiring member 31, the plural signal wiring members 32 and the insert-molding resin as the encapsulation resin 8, if a gap exists between the adapter 10 and the ceramic board 2, it is required to be covered with a sealing resin, such as a potting sealing resin, a gel or the like. Note that the adapter 10 without the encapsulation resin 8 corresponds to the conventional metal frame (lead frame for wiring). Further, the adapter 10 with the encapsulation resin 8 can be said to be a wiring-member aggregation assembly in which the relative positions of the main-electrode wiring member 31 and the plural signal wiring members 32 are fixed. When the adapter 10 with the encapsulation resin 8 is to be fabricated by an insert molding method, the main-electrode wiring member 31 and the signal wiring members 32 that are apart from each other may be sealed beforehand with an encapsulation resin 8. Further, the adapter 10 with the encapsulation resin 8 may also be provided in such a manner that the main-electrode wiring member 31 and the signal wiring members 32 that have been unified together by a frame (peripheral frame), is encapsulated with the encapsulation resin 8, and thereafter, the main-electrode wiring member 31 and the signal wiring members 32 are separated off from the frame.

As described above, the power module 100 of Embodiment 1 is characterized by comprising the power semiconductor element 1 mounted on a circuit board (ceramic board 2), and the adapter 10 connected to a front-surface main electrode (emitter electrode 14e) of the power semiconductor element 1, wherein the adapter 10 includes the main-electrode wiring member 31 which is connected to the front-surface main electrode (emitter electrode 14e) of the power semiconductor element 1, and wherein the main-electrode wiring member 31 includes: the element connection portion 311 connected to the front-surface main electrode (emitter electrode 14e) of the power semiconductor element 1; the board connection portion 312 which is placed outside the element connection portion 311 and connected to the circuit board (ceramic board 2); and a connector connection portion (wire connection portion 313) which is placed outside the element connection portion 311 and connected to an external electrode through a connector (wire 7). Because of these characteristics, in the power module 100 of Embodiment 1, the main-electrode wiring member 31 of the adapter 10 which is connected to the front-surface main electrode (emitter electrode 14e) of the power semiconductor element 1 includes, outside the element connection portion 311 and the board connection portion 312, the connector connection portion (wire connection portion 313) which is connected to the external electrode through the connector (wire 7). Thus, the power module can make connection between the external electrode provided as an external terminal part and the front-surface electrode (emitter electrode 14e) of the power semiconductor 1 without the connection being routed through the conductive layer on the circuit board (ceramic board 2), and is operable at a high temperature even when the connector (wire 7) connected to the external terminal part is made of aluminum, thus making it possible to improve the reliability.

Embodiment 2

Figure 9:
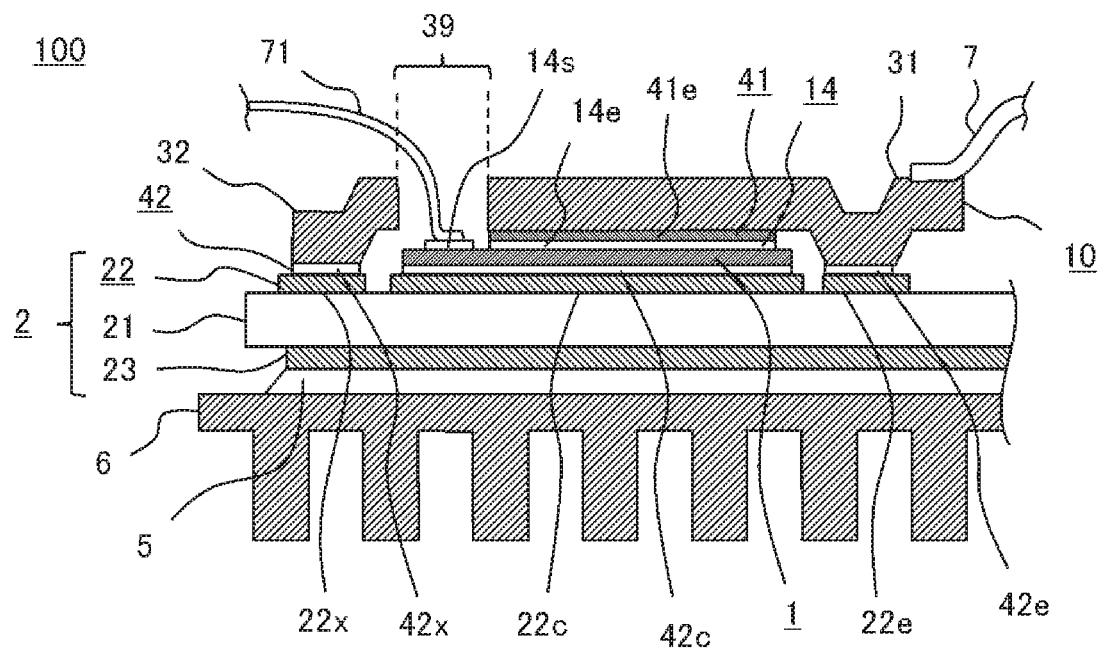
FIG. 9 is a cross-sectional schematic view of a power module according to Embodiment 2 of the invention.

FIG. 9 is a cross-sectional schematic view of a power module according to Embodiment 2 of the invention. The power module 100 according to Embodiment 2 is an example in which an opening portion 39 is formed near the signal electrodes 14s of the power semiconductor element 1, so that the signal electrodes 14s and unshown external electrodes are connected therethrough to each other by way of wires 71. In FIG. 9, the signal wiring members 32 are members to be connected to unshown signal electrodes of another power semiconductor element and to non-fine-pitch signal electrodes 14s of the power semiconductor element 1. In FIG. 9, with respect to the conductive layer 22 of the ceramic board 2, its portion which is connected to the signal wiring member 32 is indicated as a conductive layer 22x, and with respect to the silver-sintered bonding portion 42, its portion where the conductive layer 22x and the signal wiring member 32 are bonded together is indicated as a silver-sintered bonding portion 42x.

The adapter 10 of Embodiment 2 does not include the encapsulation resin 8 that is an insert-molding resin used in an insert molding method, but includes at least the main-electrode wiring member 31 connected to the emitter electrode 14e (front-surface main electrode) of the power semiconductor element 1. In FIG. 9, such a case is shown in which the adapter 10 includes the main-electrode wiring member 31 connected to the emitter electrode 14e (front-surface main electrode) of the power semiconductor element 1, and the signal wiring members 32 connected to the unshown signal electrodes of another power semiconductor element and to the non-fine-pitch signal electrodes 14s of the power semiconductor element 1.

In the case where a plurality of fine-pitch signal electrodes 14s are placed, when the signal electrodes 14s and the signal wiring members 32 are bonded together by silver sintering, a possibility arises that the adjacent signal electrodes 14s or signal wiring members 32 may be interconnected to each other, thus causing insulation failure. In the case where a plurality of fine-pitch signal electrodes 14s are placed, when the signal electrodes 14s and the unshown external electrodes are connected to each other by way of the wires 71 as in the power module according to Embodiment 2, it is possible to reduce insulation failure mediated by the silver-sintering bonding material, even for the signal electrodes 14s closely placed to each other.

Meanwhile, in many cases, the signal electrodes 14s of the power semiconductor element 1 are not subjected to metallization that makes the electrodes bondable to metal. Because the power module 100 according to Embodiment 2 has the opening portion 39 near the signal electrodes 14s of the power semiconductor element 1, even in the case where the signal electrodes 14s are not subjected to metallization that makes the electrodes bondable to metal, it becomes possible to perform wire bonding for the signal electrodes 14s not subjected to metallization that makes the electrodes bondable to metal.

Embodiment 3

Figure 10:
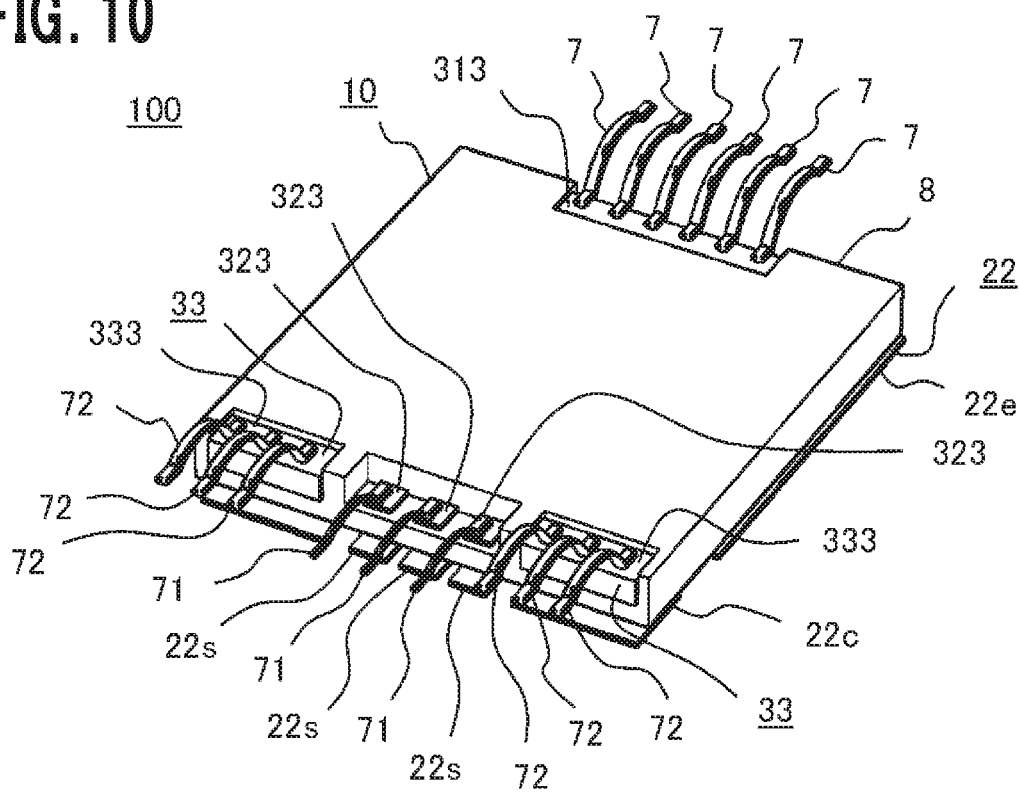
FIG. 10 is a bird's-eye view of a power module according to Embodiment 3 of the invention.
Figure 11:
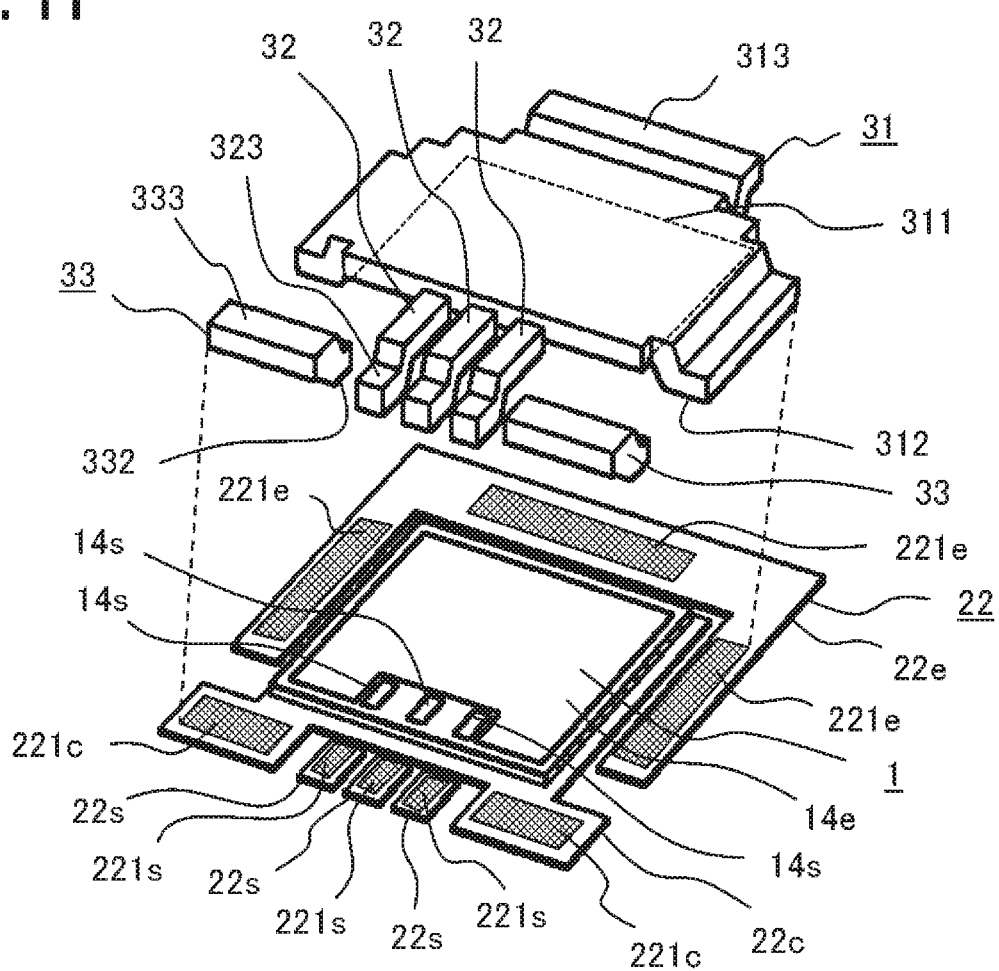
FIG. 11 is a bird's-eye view showing wiring members of an adapter and a conductive layer of a ceramic board in FIG. 10.

In Embodiment 3, a power module 100 will be described which includes main-electrode wiring members 33 each connected to the collector electrode (back-surface main electrode) 13 formed on the back surface of the power semiconductor element 1, through the conductive layer 22 of the ceramic board 2. FIG. 10 is a bird's-eye view of the power module according to Embodiment 3 of the invention, and FIG. 11 is a bird's-eye view showing the wiring members of an adapter in FIG. 10 and the conductive layer of the ceramic board. Note that, in FIG. 10 and FIG. 11, the ceramic base member 21 and the conductive layer 23 of the ceramic board 2, and the heat dissipation fin 6 are omitted from illustration. Each main-electrode wiring member 33 is connected to the collector electrode 13 provided as a back-surface main electrode, and is thus a back-surface main-electrode wiring member.

The adapter 10 of Embodiment 3 includes the main-electrode wiring member 31, the plural signal wiring members 32, the plural main-electrode wiring members 33 and the encapsulation resin 8. The encapsulation resin 8 is an insert-molding resin used in an insert molding method. The adapter 10 of Embodiment 3 differs from the adapter 10 of Embodiment 1 in having the plural main-electrode wiring members 33. The parts different to those in Embodiment 1 will be described. As shown in FIG. 11, the main-electrode wiring member 33 has a board connection portion 332 and a wire connection portion (connector connection portion) 333. The conductive layer 22 of the ceramic board 2 has: the conductive layer 22e to which the emitter electrode 14e is connected through the main-electrode wiring member 31; the conductive layers 22s to which the signal electrodes 14s are connected through the signal wiring members 32; and the conductive layer 22c to which the back surface of the power semiconductor element 1 is die-bonded and which extends to the periphery of the power semiconductor element 1. The main-electrode wiring member 31 and the signal wiring members 32 are the same as in Embodiment 1.

The three board connection portions 312 in the main-electrode wiring member 31 are connected to the conductive layer 22e at its three connection areas 221e through the silver-sintered bonding portions 42e. The board connection portion 322 of each of the signal wiring members 32 is connected to the conductive layer 22s at its connection area 221s through the silver-sintered bonding portion 42s. Like the main-electrode wiring member 31 and the signal wiring member 32, the board connection portion 332 of each of the main-electrode wiring members 33 is bonded by silver sintering to the conductive layer 22c at its connection area 221c. Specifically, the board connection portion 332 in the main-electrode wiring member 33 is connected to the conductive layer 22c at the connection area 221c through the silver-sintered bonding portion 42.

In FIG. 10, at both sides around the wire connection portions 323 of the three signal wiring members 32, the wire connection portions 333 of the main-electrode wiring members 33 are exposed, and three wires are connected to each of the main-electrode wiring members 33, namely, total six wires 72 are connected to the power module 100. The wire 72 serving as a connector is made, for example, of aluminum and has a diameter φ of 0.4 mm. The wire 72 makes connection between an unshown external electrode and the main-electrode wiring member 33.

Other than the above, the power module 100 of Embodiment 3 is the same as the power module 100 of Embodiment 1, and thus accomplishes an effect similar to in Embodiment 1. Further, according to the power module 100 of Embodiment 3, because of the addition of the main-electrode wiring members 33, every external wiring can be established on the wiring members of the main-electrode wiring member 31, the signal wiring members 32 and the main-electrode wiring members 33. Thus, according to the power module 100 of Embodiment 3, with respect to the conductive layer 22 of the ceramic board 2, such metallization in consideration of wire-bonding joint strength (wire bonding capability) required for wired connection is unnecessary for the conductive layer 22, so that metallization dedicated to bonding between the wiring members, such as silver-sintering bonding or the like, is applicable to the conductive layer 22. In addition, according to the power module 100 of Embodiment 3, no wire is connected to the conductive layer 22 of the ceramic board 2, and thus there is no need to ensure wire-connection-portion cleanness.

In the power module 100 of Embodiment 3, the wire connection portions 313, 323, 333 of the adapter 10 are each formed to have a surface that is nearly parallel (substantially parallel) to the ceramic base member 21 of the ceramic board 2. Thus, according to the power module 100 of Embodiment 3, it becomes easier to perform wire bonding without application of an ultrasonic wave or wire bonding with application of an ultrasonic wave, for the wire connection portions 313, 323, 333 of the adapter 10.

Embodiment 4

Figure 12:
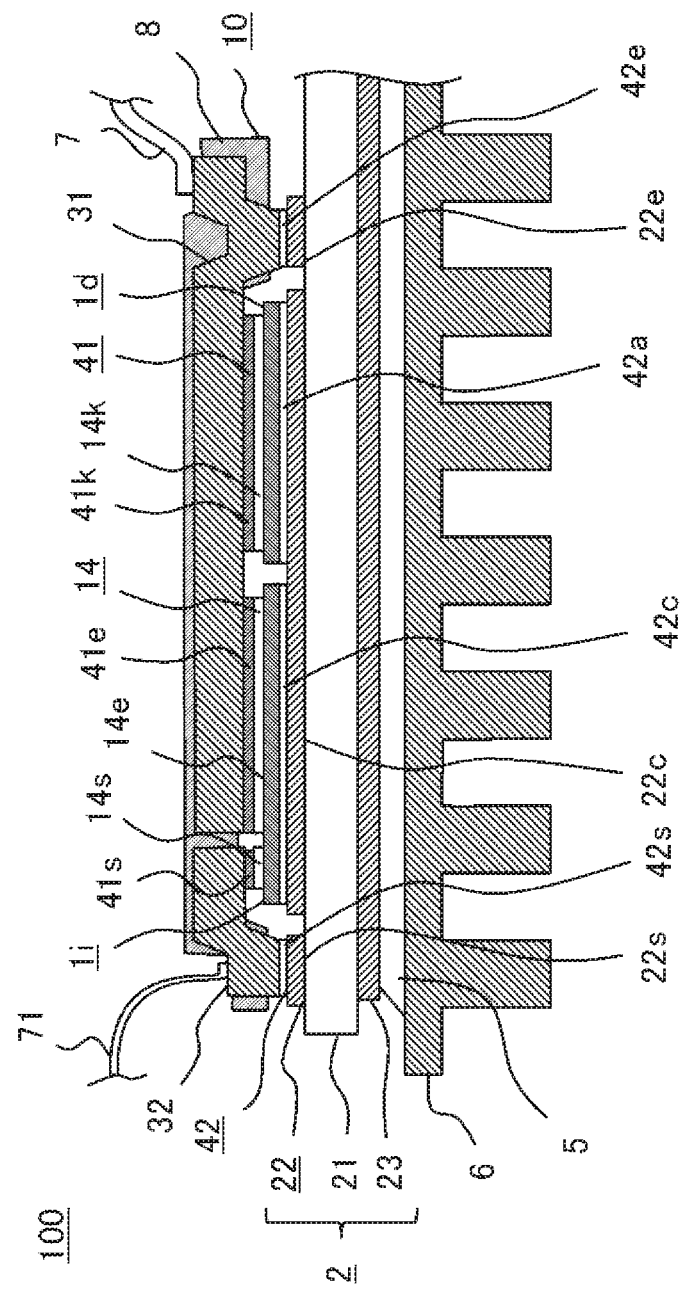
FIG. 12 is a cross-sectional schematic view of a power module according to Embodiment 4 of the invention.
Figure 13:
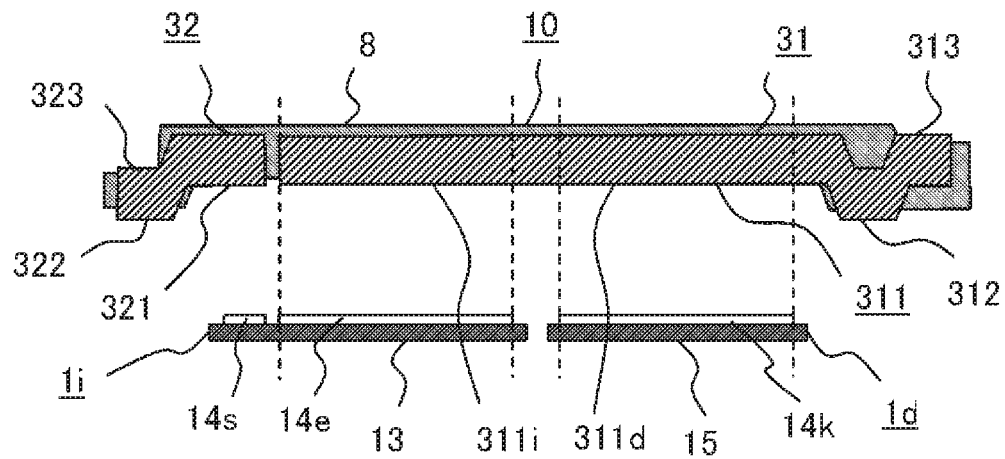
FIG. 13 is a diagram showing an adapter and a power semiconductor element in FIG. 12.

FIG. 12 is a cross-sectional schematic view of a power module according to Embodiment 4 of the invention, and FIG. 13 is a diagram showing an adapter and a power semiconductor element in FIG. 12. A power module 100 of Embodiment 4 differs from the power module 100 of Embodiment 1 in that two power semiconductor elements 1 are mounted therein and a single main-electrode wiring member 31 is connected to the front-surface main electrodes of the two power semiconductor elements 1. Here, description will be made about a case where the two power semiconductor elements 1 are a switching element 1i and a diode 1d. The switching element 1i is, for example, an IGBT.

A ceramic board 2 is mounted on a heat dissipation fin 6 by use of a thermal grease 5. The heat dissipation fin 6 is formed, for example, by aluminum forging, whose size is 100 mm in length, 150 mm in width and 12 mm in thickness. The ceramic board 2 includes a ceramic base member 21, a conductive layer 22 formed on the front side of the ceramic base member 21, and a conductive layer 23 formed on the back side of the ceramic base member 21. The ceramic base member 21 is made, for example, of AlN, whose size is 95 mm in length, 145 mm in width and 0.635 mm in thickness. The conductive layers 22 and 23 are made, for example, of copper, and have a thickness of 0.4 mm. The conductive layer 22 is formed into a plurality of patterns, an example of which is illustrated in FIG. 12 as having three conductive layers 22c, 22s, 22e. On the surface of the conductive layer 22, a silver-sintered bonding portion 42 is formed. The silver-sintered bonding portion 42 has silver-sintered bonding portions 42s, 42e corresponding to the conductive layers 22s, 22e, and silver-sintered bonding portions 42c, 42a corresponding to a collector electrode (back-surface main electrode) 13 of the switching element 1i and an anode electrode (back-surface main electrode) 15 of the diode 1d, that are to be connected to the conductive layer 22c.

To the conductive layer 22, the switching element 1i and the diode 1d are die-bonded using a silver-sintering bonding material. The switching element 1i is an IGBT made of Si, whose size is 15 mm in length, 15 mm in width and 0.3 mm in thickness. The diode 1d is made of Si, whose size is 15 mm in length, 10 mm in width and 0.3 mm in thickness. The collector electrode 13 formed on the back-surface side of the switching element 1i is connected to the conductive layer 22c through the silver-sintered bonding portion 42c resulting from solidification of the silver-sintering bonding material. The anode electrode 15 formed on the back-surface side of the diode 1d is connected to the conductive layer 22c through the silver-sintered bonding portion 42a resulting from solidification of the silver-sintering bonding material. A front-surface electrode 14 formed on the front-surface side of the switching element 1i provided as the IGBT, comprises an emitter electrode 14e and signal electrodes 14s.

An adapter 10 having plural wiring members is placed above the switching element 1i and the diode 1d. The adapter 10 includes a main-electrode wiring member 31, signal wiring members 32 and an encapsulation resin 8. The main-electrode wiring member 31 and the signal wiring members 32 are formed as they are punched out of a copper frame having a thickness of 0.6 mm. The main-electrode wiring member 31 and the signal wiring members 32 are placed in conjunction with each other, namely, placed adjacent to each other, and are encapsulated with the encapsulation resin 8. The encapsulation resin 8 is made, for example, of PPS.

The main-electrode wiring member 31 includes: an element connection portion 311 to be connected to the front-surface main electrodes of the switching element 1i and the diode 1d; board connection portions 312 to be connected to the conductive layer 22e of the ceramic board 2; and a wire connection portion 313 to be connected to wires 7. The element connection portion 311 has an element connection portion 311i to be connected to the emitter electrode 14e of the switching element 1i, and an element connection portion 311d to be connected to a cathode electrode 14k of the diode 1d. Each of the signal wiring members 32 includes: an element connection portion 321 to be connected to the signal electrode 14s of the switching element 1i; a board connection portion 322 to be connected to the conductive layer 22s of the ceramic board 2; and a wire connection portion 323 to be connected to a wire 71.

The element connection portion 311 of the main-electrode wiring member 31 is exposed from the encapsulation resin 8 and bonded to the emitter electrode 14e (front-surface main electrode) of the switching element 1i and to the cathode electrode 14k (front-surface main electrode) of the diode 1d, by way of a silver-sintered bonding portion 41. The silver-sintered bonding portion 41 is a bonding layer resulting from solidification of silver-sintering bonding materials placed on the front-surface electrode 14 of the switching element 1i and the cathode electrode 14k provided as the front-surface main electrode of the diode 1d. The silver-sintered bonding portion 41 has: a silver-sintered bonding portion 41e formed on the emitter electrode 14e of the switching element 1i; a silver-sintered bonding portion 41s formed on each of the signal electrodes 14s of the switching element 1i; and a silver-sintered bonding portion 41k formed on the cathode electrode 14k of the diode 1d. The board connection portions 312 and the wire connection portion 313 are formed by a step-forming process. Like in FIG. 4 and FIG. 5, the board connection portions 312 are formed as they are distributed in directions toward three outer edges of the semiconductor-element placement region in which the switching element 1i and the diode 1d are placed. Of these, with respect to the board connection portion 312 in one direction, the extending end portion thereof is lifted up by a step-forming process, so that the wire connection portion 313 is formed. Each of the board connection portions 312 is connected to the conductive layer 22e of the ceramic board 2 through the silver-sintered bonding portion 42e. The wire connection portion 313 is exposed upward from the encapsulation resin 8 and is connected to the wires 7.

Like the element connection portion 311 of the main-electrode wiring member 31, the element connection portion 321 of each of the signal wiring members 32 is exposed from the encapsulation resin 8 and is bonded to the signal electrode 14s of the switching element 1i by way of the silver-sintered bonding portion 41s. The board connection portion 322 and the wire connection portion 323 are formed by a step-forming process. The board connection portion 322 and the wire connection portion 323 are extended in a direction opposite to a direction toward the wire connection portion 313 of the main-electrode wiring member 31. The board connection portion 322 is connected to the conductive layer 22s of the ceramic board 2 through the silver-sintered bonding portion 42s. The wire connection portion 323 placed above the board connection portion 322 is exposed upward from the encapsulation resin 8 and is connected to the wire 71.

Next, a fabrication process of the power module 100 will be described. The fabrication process of the power module 100 is basically the same as that described in Embodiment 1. First, the adapter 10 is fabricated. The adapter 10 is fabricated, for example, by an insert molding method. The adapter 10 is fabricated in such a manner that, after the main-electrode wiring member 31 and the signal wiring members 32 are placed in a mold for insert molding, the encapsulation resin 8 is injected into the mold. The adapter 10 in which the main-electrode wiring member 31 and the signal wiring members 32, that are placed in conjunction with each other, are fixed and adhered together by the encapsulation resin 8, is thus completed.

Then, using silver-sintering bonding materials (see, the silver-sintering bonding materials 43, 44 in FIG. 7), the switching element 1i and the diode 1d are, while being heated to 300° C. and subjected to a load of 10 MPa for 10 minutes, bonded to the element connection portions 311, 321 of the adapter 10. According to this bonding process, the emitter electrode 14e and the signal electrodes 14s of the switching element 1i, and the cathode electrode 14k of the diode 1d, are bonded to their corresponding element connection portions 311, 321 of the adapter 10, through the silver-sintered bonding portions 41e, 41s, 41k resulting from solidification of the silver-sintering bonding materials, respectively. An object resulting from bonding the adapter 10 and the power semiconductor elements 1 together is referred to as a semiconductor-element bonded assembly.

Then, like in FIG. 8, the position of the semiconductor-element bonded assembly is fixed relative to the ceramic board 2 and then, using silver-sintering bonding materials (see, the silver-sintering bonding materials 45, 46, 47 in FIG. 8), the back surfaces of the switching element 1i and the diode 1d, and the board connection portions 312, 322 of the adapter 10 are, while being heated to 300° C. and subjected to a load of 10 MPa for 10 minutes, bonded to the ceramic board. As shown in FIG. 12, according to this bonding process, the back-surface electrode (collector electrode 13) of the switching element 1i, the back-surface electrode (anode electrode 15) of the diode 1d, and the board connection portions 312, 322 of the adapter 10, are bonded to the conductive layers 22c, 22e, 22s of the ceramic board 2 through the silver-sintered bonding portions 42c, 42a, 42e, 42s resulting from solidification of the silver-sintering bonding materials, respectively.

Then, as shown in FIG. 12, the wires 71 are connected to the wire connection portions 323 of the adapter 10 by use of a wire bonder, and the wires 7 are connected to the wire connection portion 313 of the adapter 10 by use of a wire bonder. The wire 71 is made, for example, of aluminum and has a diameter ϕ of 0.15 mm. The wire 7 is made, for example, of aluminum and has a diameter ϕ of 0.4 mm. Thereafter, using the thermal grease 5, the ceramic board 2 is mounted on the heat dissipation fin 6 and adhered thereto. Lastly, but where necessary, sealing is carried out with a gel (silicone resin), a potting sealing resin (epoxy resin) or the like, in such a manner that the wire bonding portions where the wire connection portions 323 and the wires 71 are bonded together, the wire bonding portions where the wire connection portion 313 and the wires 7 are bonded together, and the like, are immerged in that resin.

Figure 14:
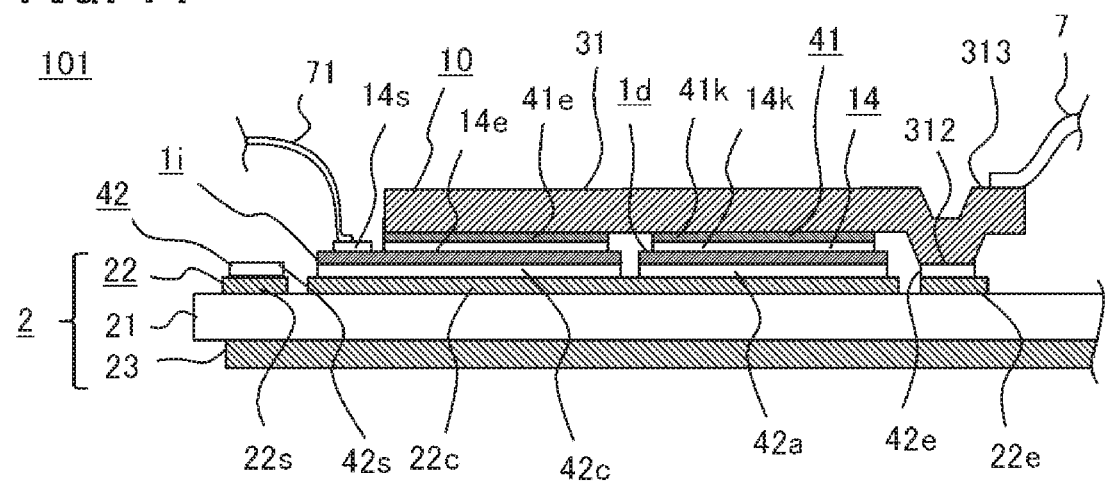
FIG. 14 is a cross-sectional schematic view of a sample for evaluating the power module of FIG. 12.
Figure 15:
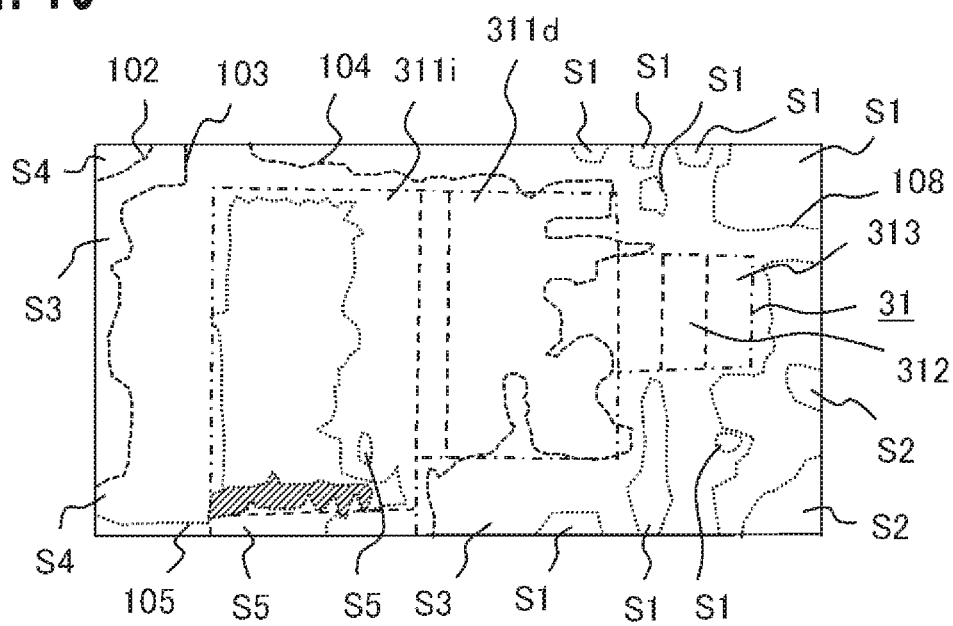
FIG. 15 is a diagram showing a measurement result on the sample of FIG. 14.

A heat producing state of the power module 100 was measured using an evaluation sample. The heat producing state was measured using a thermo-viewer. FIG. 14 is a cross-sectional schematic view of the sample for evaluating the power module of FIG. 12, and FIG. 15 is a diagram showing a measurement result on the sample of FIG. 14. As shown in FIG. 14, the sample for heat measurement 101 in which the signal electrodes 14s of the switching element 1i are connected by way of the wires 71 was fabricated. The result monitored by the thermo-viewer and shown in FIG. 15 is a monitoring result in a state in which a current is caused to flow through the switching element 1i so that its temperature becomes about 130° C. Note that, in order to make the monitoring result in FIG. 15 easier to understand, typical temperature boundaries are shown in the result.

In FIG. 15, placement positions of the main-electrode wiring member 31, the wire connection portion 313, the board connection portion 312 joined to the wire connection portion 313, the element connection portion 311d for the diode 1d and the element connection portion 311i for the switching element 1i, are additionally indicated. The placement position of the main-electrode wiring member 31 is indicated by a dot-and-dash line. Further, in FIG. 15, the typical temperature boundaries are indicated by broken lines 102, 103, 104 and dotted lines 105, 108. The broken lines 102, 103, 104 each represent a boundary of 95° C., the dotted line 105 represents a boundary of 120° C., and the dotted line 108 represents a boundary of 75° C. In FIG. 15, temperature areas S1, S2, S3, S4, S5 partitioned by the broken lines 102, 103, 104 and the dotted lines 105, 108 are indicated. The temperature area S1 is at less than 75° C., the temperature area S2 is at 75° C. or more but less than 80° C., the temperature area S3 is at 80° C. or more but less than 95° C., and the temperature area S4 is at 95° C. or more but less than 120° C. The temperature area S5 is at 120° C. or more. A lower portion (hatched-pattern portion) in the element connection portion 311i is at about 130° C.

As shown in FIG. 15, it is found that a wiring-member temperature in the main-electrode wiring member 31 decreases as its position becomes farther from the element connection portion 311i for the switching element 1i and closer to the board connection portion 312, so that the temperature is lowered to 80° C. at around the wire connection portion 313.

In the power module 100 of Embodiment 4, the main-electrode wiring member 31 connected to the front-surface main electrodes of the switching element 1i and the diode 1d which are each provided as a power semiconductor element, and the signal wiring members 32, have the board connection portions 312, 322 connected to the ceramic board 2. This makes it possible to dissipate heat at the board connection portions 312, 322 to the ceramic board 2 provided as the circuit board, so that the surface temperatures of the wire connection portions 313, 323 can be made sufficiently lower than the element temperatures of the switching element 1i and the diode 1d. Because the temperatures of the wire connection portions 313, 323 are sufficiently lower than the operation temperatures of the power semiconductor elements 1, the power module 100 of Embodiment 4 is operable at a high temperature even when the wires 7, 71 serving as connectors are made of aluminum, thus making it possible to improve the reliability.

The power module 100 of Embodiment 4 differs from the power module 100 of Embodiment 1 merely in that the two power semiconductor elements 1 are mounted therein and the single main-electrode wiring member 31 is connected to the front-surface main electrodes of the two power semiconductor elements 1. Thus, the power module 100 of Embodiment 4 accomplishes an effect similar to that of the power module 100 of Embodiment 1.

Because the front-surface main electrodes of the switching element 1i and the diode 1d are connected together by the single main-electrode wiring member 31, the power module 100 of Embodiment 4 can be made smaller than the module in which main-electrode wiring members 31 are individually connected to the switching element 1i and the diode 1d. Further, in the power module 100 of Embodiment 4, because the front-surface main electrodes of the switching element 1i and the diode 1d are connected together by the single main-electrode wiring member 31, the switching element 1i and the diode 1d can be connected together in a shortest and low-resistance manner, so that the characteristics of the power module can be improved.

Here, the description has been made citing a case in which the ceramic base member 21 of the ceramic board 2 is made of AlN; however, the base member may be made of SiN (silicon nitride) or alumina. Even in this case, an effect similar to that in the case of the ceramic base member 21 being made of AlN is achieved. With respect also to the conductive layers 22, 23 of the ceramic board 2, there is no need to limit them to those of copper, and they may be of aluminum. Further, a metallic board in which a resin insulating layer is laminated on a metal plate may be used in place of the ceramic board 2.

Here, the description has been made also citing a case where the main-electrode wiring member 31 and the signal wiring members 32 are formed as they are punched out of a copper lead frame. There is no need to limit the materials of the main-electrode wiring member 31 and the signal wiring members 32 to copper, and the material may be Kovar or 42-Alloy having a thermal expansion coefficient close to that of the switching element 1$i$ and diode 1$d$ or the ceramic board 2, or may use a CIC clad material. When the main-electrode wiring member 31 and the signal wiring members 32 are formed of a material having a thermal expansion coefficient close to that of the switching element 1$i$ and diode 1$d$ or the ceramic board 2, it is possible to reduce a thermal stress applied to the silver-sintered bonding portions 41, 42. When the main-electrode wiring member 31 and the signal wiring members 32 are made of copper, the formation of a slit or opening portion in the main-electrode wiring member 31 or the signal wiring member 32 makes it possible for the power module 100 to reduce the rigidity of the main-electrode wiring member 31 or the signal wiring member 32, to thereby reduce a stress applied to the bonding portion, such as the silver-sintered bonding portion 41, 42 or the like. Further, the description has been made citing a case where the wire connection portion 313 is formed on the opposite surface that is opposite to the surface on which the element connection portion 311 and the board connection portions 312 are placed; however, the wire connection portion 313 may be formed on a part of the surface on which the element connection portion 311 and the board connection portions 312 are formed, after the part is provided as an upper surface in such a manner that the end part of the main-electrode wiring member 31 is folded back.

Here, the description has been made also citing a case where the silver-sintering bonding material is used for the bonding between the wiring member, such as the main-electrode wiring member 31 or the signal wiring member 32, and the switching element 1$i$, the diode 1$d$ or the ceramic board 2; however, when the upper temperature limit required for the power module 100 is not so high, the bonding may be performed using a tin-base solder. When the upper temperature limit required for the power module 100 is high, the bonding may be performed using a bismuth-base solder (melting point: 270° C.) or a gold-tin solder (melting point: 280° C.). Furthermore, high heat resistance can be also achieved when a copper powder-containing tin paste (for example, A-FAP made by KOKI Company Ltd. JAPAN) that exhibits, due to its isothermal solidification, heat resistance against a temperature higher than the bonding temperature, is used as the bonding material.

Here, the description has been made also citing a case where the adapter 10 is fabricated using an insert molding method. The encapsulation resin 8 used in the insert molding method is an insert-molding resin. Further, the description has been made citing a case where PPS (thermal softening temperature: 280° C.) is used as the insert-molding resin; however, there is no need to limit the resin to PPS, and the liquid crystal polymer (thermal softening temperature: 340° C. or more) named LCP-8 may be used as the insert-molding resin. Other than PPS, LCP-8 is selectable as the insert-molding resin, so that flexibility is enhanced in the selection from the above bonding materials (silver-sintering bonding material, tin-base solder, bismuth-base solder, gold-tin solder, copper powder-containing tin paste).

Furthermore, when the encapsulation resin 8 is a thermoplastic insert-molding resin, it is also allowable to cause the insert-molding resin to melt to spread over the metallic wiring members, such as the main-electrode wiring member 31 and the signal wiring members 32, and the switching element 1$i$ and the diode 1$d$, to thereby serve as their sealing material. Namely, after the adapter 10 and the power semiconductor elements 1 are bonded to the ceramic board 2, they are heated up to the softening temperature of the insert-molding resin. This makes it possible to cause the insert-molding resin to thermally soften and melt to spread over the metallic wiring members, such as the main-electrode wiring member 31 and the signal wiring members 32, and the switching element 1$i$ and the diode 1$d$, to thereby serve as their sealing material. In this case, because the encapsulation resin 8 that seals the metallic wiring members, such as the main-electrode wiring member 31 and the signal wiring members 32, is the thermoplastic insert-molding resin, it is possible to concurrently carry out the silver-sintering bonding process for bonding the adapter 10, the switching element 1$i$ and the diode 1$d$ to the ceramic board 2, and the sealing process for sealing the gaps between the adapter 10 and the ceramic board 2.

Here, the description has been made also citing a case where the wires made of aluminum are used for connecting the wire connection portions 313, 323 of the adapter 10 to the unshown external electrodes; however, other connectors may be instead used. As the other connector, an aluminum-alloy wire or a copper wire, or an aluminum ribbon or a copper ribbon may be used. Favorable bonding can also be done in such a manner that a copper-plate bus bar is subjected to ultrasonic bonding, or a copper-plate bus bar is subjected to spot welding, friction stir welding, or the like.

Embodiment 5

Figure 16:
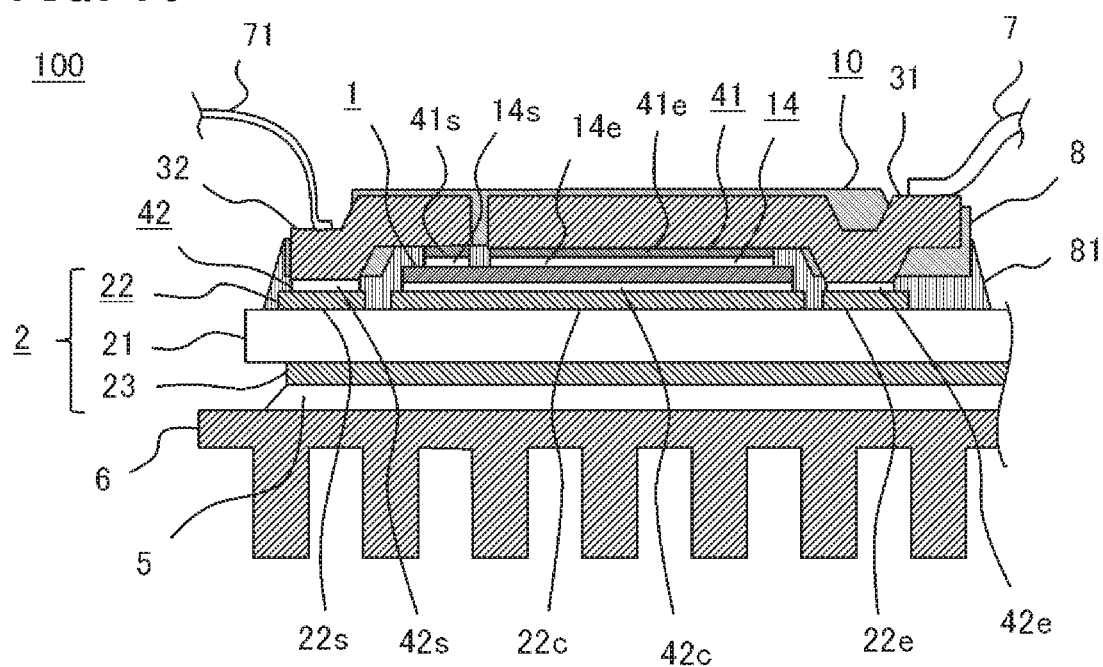
FIG. 16 is a cross-sectional schematic view of a power module according to Embodiment 5 of the invention.

FIG. 16 is a cross-sectional schematic view of a power module according to Embodiment 5 of the invention. A power module 100 of Embodiment 5 differs from the power module 100 of Embodiment 1 in that the silver-sintered bonding portions 41, 42 are covered with a gap sealing material 81. As described in Embodiment 1, after the power semiconductor element 1 is bonded to the adapter 10 and the ceramic board 2 through the silver-sintered bonding portions 41, 42, the ceramic board 2 is mounted on the heat dissipation fin 6 and adhered thereto by use of the thermal grease 5. Lastly, but where necessary, sealing is carried out with a gel (silicone resin), a potting sealing resin (epoxy resin) or the like, in such a manner that the wire bonding portions where the wire connection portions 323 and the wires 71 are bonded together, the wire bonding portions where the wire connection portion 313 and the wires 7 are bonded together, and the like, are immerged in that resin. On this occasion, the gel or the potting sealing resin concurrently covers: a peripheral portion of the adapter 10, which extends from its facing portion facing the ceramic board 2 and in a direction away from the ceramic board 2; and a portion of the ceramic board 2 in the vicinity of the peripheral portion of the adapter 10.

Figure 17:
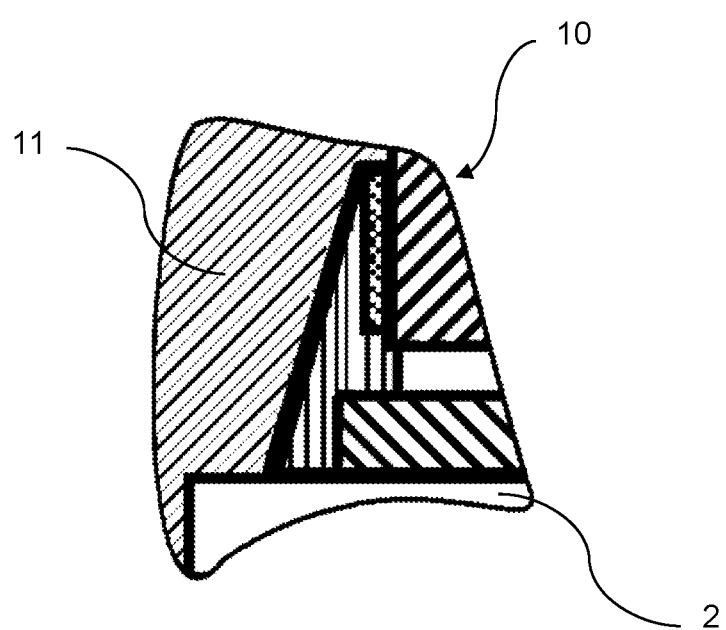
FIG. 17 is cross-sectional and partial schematic view of a power module according to an exemplary embodiment of the disclosure.

When sealing is carried out with the gel, the potting sealing resin or the like, in such a manner that: the peripheral portion of the adapter 10 and the portion of the ceramic board 2 in the vicinity of the peripheral portion of the adapter 10 are covered with that resin shown as resin 11 in FIG. 17); and the wire bonding portions where the wire connection portions 323 and the wires 71 are bonded together, the wire bonding portions where the wire connection portion 313 and the wires 7 are bonded together, and the like, are immerged in that resin 11, it is desirable to use as the gap sealing material 81, such a sealing material, for example, a polyimide resin or a low-temperature fired glass paste, whose heat resistance (thermal softening temperature) is higher than that of the gel or the potting sealing resin 11. According to the power module 100 of Embodiment 5, because the silver-sintered bonding portions 41, 42 are covered with the gap sealing material 81 whose heat resistance (thermal softening temperature) is higher than that of the gel or the potting sealing resin, and thus the gaps between the power semiconductor element 1 and the main-electrode wiring member 31 and signal wiring members 32 are sealed, it is possible to avoid the power semiconductor element 1 to be operated at a high temperature from making direct contact with the gel or the potting sealing resin, so that increased heat resistance can be ensured. Note that such a method of covering the silver-sintered bonding portions 41, 42 with the gap sealing member 81 may also be applied to the power modules 100 of Embodiments 2 to 4.

It is noted that, in Embodiments 1 to 5, the power semiconductor element 1 may be a usual element (element made of Si) whose base member is a silicon wafer; however, in this invention, a so-called wide bandgap semiconductor material can be applied which is represented by silicon carbide (SiC), a gallium nitride (GaN)-based material or diamond, that is wider in bandgap than silicon. As the power semiconductor element 1, a diode or IGBT is not limited, and a MOSFET (Metal Oxide Semiconductor Field-Effect-Transistor) or like switching element, may be mounted. For example, when silicon carbide (SiC), a gallium nitride (GaN)-based material or diamond is used for a power semiconductor element 1 serving as a switching element or a power semiconductor element 1 serving as a rectifying element, because its power loss is lower than that of a conventionally-used element formed of silicon (Si), the efficiency of the power module 100 can be enhanced. Further, because its withstanding voltage is high and its allowable current density is also high, the power module 100 can be downsized. Furthermore, because the wide bandgap semiconductor element has high heat resistance, it is operable at a high temperature. This allows the heat-dissipation fin 6 to be downsized and the water cooling unit to be substituted with an air cooling one, so that the power module 100 provided with the heat dissipation fin 6 can be further downsized.

It should be noted that any combination of the respective embodiments, and any appropriate modification or omission in the embodiments may be made in the present invention without departing from the scope of the invention.

DESCRIPTION OF REFERENCE NUMERALS AND SIGNS

1: power semiconductor element, 1d: diode, 1i: switching element, 2: ceramic board (circuit board), 7: wire (connector), 8: encapsulation resin, 10: adapter, 13: collector electrode (back-surface main electrode), 14e: emitter electrode (front-surface main electrode), 14s: signal electrode (front-surface signal electrode), 14k: cathode electrode (front-surface main electrode), 22: conductive layer, 22c: conductive layer, 31: main-electrode wiring member, 32: signal wiring member, 33: main-electrode wiring member (back-surface main-electrode wiring member), 39: opening portion, 81: gap sealing material, 100: power module, 311: element connection portion, 312: board connection portion, 313: wire connection portion (connector connection portion), 321: element connection portion (element signal-connection portion), 322: board connection portion (board signal-connection portion), 323: wire connection portion (connector signal-connection portion), 333: wire connection portion (connector connection portion).

The invention claimed is:

1. A power module which comprises a power semiconductor element mounted on a circuit board, and an adapter connected to a front-surface main electrode of the power semiconductor element,
wherein the adapter includes a main-electrode wiring member which is connected to the front-surface main electrode of the power semiconductor element;
wherein the main-electrode wiring member includes: an element connection portion connected to the front-surface main electrode of the power semiconductor element; a board connection portion which is placed outside the element connection portion and connected to the circuit board; and a connector connection portion which is placed outside the element connection portion and connected to an external electrode through a connector,
wherein an opposite surface of the main-electrode wiring member, which is opposite to a surface of the main-electrode wiring member on which the element connection portion placed, is covered with a resin,
wherein the element connection portion of the main-electrode wiring member is covered with a gap sealing material,
wherein (i) a peripheral portion of the adapter, which extends from a facing portion of the adapter facing the circuit board and in a direction away from the circuit board, and (ii) the circuit board, are covered with a peripheral-portion sealing material, and
wherein the gap sealing material has heat resistance higher than that of the peripheral-portion sealing material.

2. The power module of claim 1, wherein the connector connection portion of the main-electrode wiring member is placed in substantially parallel to the circuit board.

3. The power module of claim 1, the connector connection portion of the main-electrode wiring member is placed at a height that is the same as that of the opposite surface of the main-electrode wiring member, or at a height that is lower than the opposite surface of the main-electrode wiring member.

4. The power module of claim 1, wherein the adapter includes a signal wiring member which is connected to a front-surface signal electrode of the power semiconductor element,
wherein the signal wiring member includes: an element signal-connection portion connected to the front-surface signal electrode of the power semiconductor element; a board signal-connection portion which is placed outside the element signal-connection portion and connected to the circuit board; and a connector signal-connection portion which is placed outside the element signal-connection portion and on an opposite surface of the board signal-connection portion that is opposite to a surface of the signal wiring member on which the element signal-connection portion and the board signal-connection portion are placed, and which is connected to an external electrode through a connector, wherein an opposite surface of the signal wiring member that is opposite to the surface of the signal wiring member on which the element signal-connection portion is placed, is covered with the resin, and the element signal-connection portion of the signal wiring member are covered with the gap sealing material.

5. The power module of claim 4, wherein the circuit board includes a conductive layer connected to a back-surface main electrode of the power semiconductor element, wherein the adapter includes a back-surface main-electrode wiring member connected through the conductive layer to the back-surface main electrode of the power semiconductor element, wherein the back-surface main-electrode wiring member includes, on at least a first opposite surface portion of the back-surface main-electrode wiring member that is opposite to a surface of the back-surface main-electrode wiring member connected to the conductive layer, a connector connection portion that is connected to an external electrode through a connector, and wherein at least a second opposite surface portion of the back-surface main-electrode wiring member that is opposite to the surface of the back-surface main-electrode wiring member connected to the conductive layer, is partly covered with the resin.

6. The power module of claim 1, wherein the circuit board includes a conductive layer connected to a back-surface main electrode of the power semiconductor element, wherein the adapter includes a back-surface main-electrode wiring member connected through the conductive layer to the back-surface main electrode of the power semiconductor element, wherein the back-surface main-electrode wiring member includes, on an opposite surface of the back-surface main-electrode wiring member that is opposite to a surface of the back-surface main-electrode wiring member connected to the conductive layer, a connector connection portion that is connected to an external electrode through a connector, and wherein an opposite surface of the back-surface main-electrode wiring member that is opposite to the surface of the back-surface main-electrode wiring member connected to the conductive layer, is partly covered with the resin.

7. The power module of claim 1, wherein a switching element and a diode each provided as the power semiconductor element are mounted on the circuit board, and wherein the main-electrode wiring member of the adapter is connected to the front-surface main electrode of each of the switching element and the diode.

8. The power module of claim 1, wherein a switching element and a diode each provided as the power semiconductor element are mounted on the same surface of the circuit board, and wherein the main-electrode wiring member of the adapter is connected to the front-surface main electrode of each of the switching element and the diode.

9. The power module of claim 1, wherein the adapter is an adapter that is partly covered by an insert molding method with a thermoplastic insert-molding resin, wherein said resin is the thermoplastic insert-molding resin, and wherein the power semiconductor element is covered with the thermoplastic insert-molding resin having been softened.

10. The power module of claim 1, wherein the power semiconductor element includes a front-surface signal electrode through which a first current flows, the first current being smaller than a second current flowing through the front-surface main electrode, and wherein an opening portion is provided above the front-surface signal electrode through which a connector for connecting the front-surface signal electrode to an external electrode is placed.

11. The power module of claim 1, wherein said connector is a wire or ribbon made of aluminum or copper.

12. The power module of claim 1, wherein the power semiconductor element is formed of a wide bandgap semiconductor material.

13. The power module of claim 12, wherein the wide bandgap semiconductor material is silicon carbide, a gallium nitride-based material or diamond.

14. The power module of claim 1, wherein the connector connection portion of the main-electrode wiring member is placed at a height that is the same as that of a surface of the main-electrode wiring member on the opposite surface of the main-electrode wiring member.

15. The power module of claim 14, wherein the adapter includes a signal wiring member which is connected to a front-surface signal electrode of the power semiconductor element, and wherein the signal wiring member includes: an element signal-connection portion connected to the front-surface signal electrode of the power semiconductor element; a board signal-connection portion which is placed outside the element signal-connection portion and connected to the circuit board; and a connector signal-connection portion which is placed outside the element signal-connection portion and on an opposite surface of the board signal-connection portion that is opposite to a surface of the signal wiring member on which the element signal-connection portion and the board signal-connection portion are placed, and which is connected to an external electrode through a connector.

16. The power module of claim 15, wherein the circuit board includes a conductive layer connected to a back-surface main electrode of the power semiconductor element, wherein the adapter includes a back-surface main-electrode wiring member connected through the conductive layer to the back-surface main electrode of the power semiconductor element, and wherein the back-surface main-electrode wiring member includes, on an opposite surface of the back-surface main-electrode wiring member that is opposite to a surface of the back-surface main-electrode wiring member connected to the conductive layer, a connector connection portion that is connected to an external electrode through a connector.

17. The power module of claim 14, wherein the circuit board includes a conductive layer connected to a back-surface main electrode of the power semiconductor element, wherein the adapter includes a back-surface main-electrode wiring member connected through the conductive layer to the back-surface main electrode of the power semiconductor element, and wherein the back-surface main-electrode wiring member includes, on an opposite surface of the back-surface main-electrode wiring member that is opposite to a surface of the back-surface main-electrode wiring member connected to the conductive layer, a connector connection portion that is connected to an external electrode through a connector.

18. A power module which comprises a power semiconductor element mounted on a circuit board, and an adapter connected to a front-surface main electrode of the power semiconductor element,
    wherein the adapter includes a main-electrode wiring member which is connected to the front-surface main electrode of the power semiconductor element;
    wherein the main-electrode wiring member includes: an element connection portion connected to the front-surface main electrode of the power semiconductor element; a board connection portion which is placed outside the element connection portion and connected to the circuit board; and a connector connection portion which is placed outside the element connection portion and connected to an external electrode through a connector, and
    wherein the connector connection portion of the main-electrode wiring member is placed at a height that is the same as that of an opposite surface of the main-electrode wiring member on a side of the main-electrode wiring member opposite to the element connection portion, wherein a recess in the main-electrode wiring member separates the connector connection portion of the main-electrode wiring member from the opposite surface of the main-electrode wiring member.

19. The power module of claim 18, wherein the connector connection portion of the main-electrode wiring member is placed in substantially parallel to the circuit board.

20. The power module of claim 18, wherein the adapter includes a signal wiring member which is connected to a front-surface signal electrode of the power semiconductor element, and
    wherein the signal wiring member includes: an element signal-connection portion connected to the front-surface signal electrode of the power semiconductor element; a board signal-connection portion which is placed outside the element signal-connection portion and connected to the circuit board; and a connector signal-connection portion which is placed outside the element signal-connection portion and on an opposite surface of the board signal-connection portion that is opposite to a surface of the signal wiring member on which the element signal-connection portion and the board signal-connection portion are placed, and which is connected to an external electrode through a connector.

* * * * *